US007069386B2

(12) United States Patent
Stefan et al.

(10) Patent No.: US 7,069,386 B2
(45) Date of Patent: Jun. 27, 2006

(54) ASSOCIATIVE MEMORY DEVICE

(75) Inventors: Gheorghe Stefan, Bucuresti (RO); Dominique Thiebaut, Springfield, MA (US); Dan Tomescu, Richmond Hill (CA)

(73) Assignee: Connex Technology, Inc., Salem, NH (US)

( * ) Notice: Subject to any disclaimer, the term of this patent is extended or adjusted under 35 U.S.C. 154(b) by 0 days.

(21) Appl. No.: 10/842,075

(22) Filed: May 10, 2004

(65) Prior Publication Data

US 2004/0210727 A1 Oct. 21, 2004

Related U.S. Application Data

(63) Continuation-in-part of application No. 09/928,151, filed on Aug. 10, 2001, now Pat. No. 6,760,821.

(51) Int. Cl.
*G06F 12/00* (2006.01)

(52) U.S. Cl. ............... 711/128; 711/100; 711/108; 711/154; 365/49

(58) Field of Classification Search ............ 711/128, 711/100, 108, 154; 365/49
See application file for complete search history.

(56) References Cited

U.S. PATENT DOCUMENTS

| 4,575,818 A | 3/1986 | Almy et al. |
|---|---|---|
| 4,907,148 A | 3/1990 | Morton |
| 4,983,958 A | 1/1991 | Carrick |
| 5,122,984 A | 6/1992 | Strehler |
| 5,150,430 A | 9/1992 | Chu |
| 5,319,762 A | 6/1994 | Mayer |
| 5,329,405 A | 7/1994 | Hou et al. |
| 5,373,290 A | 12/1994 | Lempel et al. |
| 5,440,753 A | 8/1995 | Hou et al. |
| 5,448,733 A | 9/1995 | Satoh et al. |
| 5,497,488 A | 3/1996 | Akizawa et al. |
| 5,602,764 A | 2/1997 | Eskandari-Gharnin |
| 5,640,582 A | 6/1997 | Hays et al. |
| 5,818,873 A | 10/1998 | Wall et al. |
| 5,828,593 A | 10/1998 | Schultz et al. |
| 5,909,686 A * | 6/1999 | Muller et al. ............ 707/104.1 |
| 6,089,453 A | 7/2000 | Kayser et al. |
| 6,226,710 B1 * | 5/2001 | Melchior .................... 711/108 |
| 6,295,534 B1 | 9/2001 | Mann |
| 6,317,819 B1 | 11/2001 | Morton |
| 6,473,846 B1 * | 10/2002 | Melchior .................... 711/170 |
| 6,542,989 B1 | 4/2003 | Duranton |
| 6,611,524 B1 * | 8/2003 | Devanagondi et al. ... 370/395.5 |
| 6,901,476 B1 * | 5/2005 | Stark et al. ................. 711/108 |

(Continued)

OTHER PUBLICATIONS

Mitu et al., "A CMOS Implementation of a Connex Memory," pp 579-582, IEEE, 1997.

(Continued)

*Primary Examiner*—Stephen C. Elmore
(74) *Attorney, Agent, or Firm*—McCormick, Paulding & Huber LLP

(57) ABSTRACT

An associative memory support for a data processing system includes an associative memory device containing n-cells. A controller is provided for issuing an instruction to the associative memory device. A clock device outputs a synchronizing clock signal that includes a predetermined number of clock cycles per second, the clock device outputting the synchronizing clock signal to the associative memory device and the controller. The controller globally communicates the instruction to all of the n-cells simultaneously, within one of the clock cycles and the instruction is applied equally to each of the n-cells.

5 Claims, 17 Drawing Sheets

U.S. PATENT DOCUMENTS

2003/0208657 A1* 11/2003 Stark et al. .................. 711/108

OTHER PUBLICATIONS

Stefan, Gheorghe, "Silicon or Molecules? What's the Best for Splicing?", Technical Univ. of Bucharest, Dept. of Electronics, pp 158-181, 1998.

Stefan, Gheorghe, The Connex Memory. "A Physical Support for Tree/List Processing", Technical Univ. of Bucharest, Dept. of Electronics, pp. 1-22, 1994.

Stefan, Gheorge and BENEA, Robert, "Connex Memories & Rewriting Systems", Politehnica Univ. of Bucharest, Dept. of Electronics, pp 1299-1303, 1998.

Stefan, Denisa and Stefan, Gheorghe, "Bi-thread Microcontroller as Digital Signal Processor", 1997 IEEE.

Hascsi, Zoltan, Mitu, Bogdan, Petre, Mariana and Stefan Gheorghe, "High-Level Synthesis of an Enhanced Connex Memory" 1996 IEEE, pp. 163-166.

Stefan, G. and Dragnici, F., "Memory Management Unit With a PerformantLRU Circuit" Polytechnic Institute of Bucharesi, pp. 89-96, Jan 1991.

Thierbaut, Dominque and Stefan, Gheorghe, "Local Alignments of DNA Sequences with the Connex Engine" pp. 1-12, Sep. 2001.

Stefan, Gheorghe and Malita, Mihaela, "The Splicing Mechanism and the Connex Memory" Technical Univ. of Bucharest, Dept. of Electronics; Univ. of Bucharest, Fac. of Mathematics, pp. 225-229, 1997.

Hascsi, Zoltan and Stefan, Gheorghe, "The Connex Content Addressable Memory (C2AM)" "Politehnica" University of Bucharest, Electronics & Telecommunications Dpt., pp. 422-425, Sep. 1995.

* cited by examiner

ASSOCIATIVE MEMORY DEVICE

CROSS REFERENCE TO RELATED APPLICATIONS

This application is a Continuation-in-Part of, and claims priority to, allowed U.S. patent application Ser. No. 09/928,151 entitled "A MEMORY ENGINE FOR THE INSPECTION AND MANIPULATION OF DATA", filed on Aug. 10, 2001, now U.S. Pat. No. 6,760,821, as well as including essential subject matter of U.S. patent application Ser. No. 10/728,234 entitled "DATA PROCESSING SYSTEM FOR A CARTESIAN CONTROLLER", filed Dec. 4,2003, and U.S. patent application Ser. No. 10/727,811 entitled "CELLULAR ENGINE FOR A DATA PROCESSING SYSTEM", filed Dec. 4, 2003, both of which are herein incorporated by reference in their entirety.

FIELD OF THE INVENTION

The invention relates generally to an associative memory support for data processing, and more particularly, to a memory engine which utilizes improved associative techniques to provide for greater data processing speed and flexibility.

BACKGROUND OF THE INVENTION

Searching a buffer, or other memory device, comprised of symbols for strings that match a given or predetermined string of symbols is a basic operation found in many applications, such as but not limited to databases, the processing of genetic information, data compression, and the processing of computer languages. Modification of a string by inserting new sequences in it, or deleting sequences from it, is also a basic operation in these domains, and the time taken by these string operations influences directly the execution time of the main applications.

When a serial computation is performed, that is, a matching operation, to find all occurrences of strings of N symbols in a buffer containing M symbols, the maximum number of steps required is N*M. When an insertion of a character is necessary inside the buffer, on the average of half of the symbols in the buffer have to be moved one cell to the right or to the left to make room for the new cell. In this case, an average of N/2 steps are required.

Serial algorithms have been proposed to improve these operations, and they are based on several techniques including hashing, or tree data structures. Hashing is used when the strings of interests are words of fixed length. In this case each word is associated with a unique number that is used as the index where that word is stored in a dictionary. This method has the disadvantage that it works well only when the information is static, and does not change location during processing. Furthermore, generating this number is a costly operation, and sometimes several words may be associated with the same number, requiring additional work to find the word sought. Suffix trees may also be utilized and are tree structures in which all the substrings present in the buffer are stored. When one wants to see if a given string is located in the buffer, one only has to descend the tree, one character of the sought string at a time, until the string is either found, or not found. In either case, if the string contains M symbols, at most M steps are required to decide if the string is in the buffer of length L. Although this search method is fast, building the suffix tree is oftentimes computationally expensive.

The Content Addressable Memory, or CAM, is a parallel solution for finding the location of a given symbol or word in a single memory access. This method works well for fixed length words, but does not extend easily to variable length strings of symbols. When the search can be performed in parallel in the buffer, that is when M comparisons can be performed at the same time, then the number of steps is reduced to N. Buffers with parallel comparators and markers storing the result of each comparison with a given symbol have been proposed to speed up string searches. See, for example, Almy et al., U.S. Pat. No. 4,575,818; Mayer, U.S. Pat. No. 5,319,762; Eskandari-Gharnin et al., U.S. Pat. No. 5,602,764; or Satoh, et al., U.S. Pat. No. 5,448,733. These known devices typically associate a comparator with each cell of the buffer, along with a one-bit marker storing the result of the last comparison performed. The comparator, storage cell and marker operate in such a way that a symbol from the string to be located in the buffer is broadcast to all the comparators of the buffer. These comparators in turn compare the given symbol to that stored in their associated storage cell. The result of the comparison is stored in the marker associated with the comparator and storage cell.

Buffers implemented as shift registers allow their contents to be shifted to the left or to the right in parallel, synchronously to a clock signal. In this case the whole contents of the buffer can be shifted in just one step. These buffers, however, do not offer only a section of their contents to be shifted, but offer only global shift operations. Moreover, the integration of separate comparators for each cell of the buffer tends to increase the size and complexity of the device as a whole, thus leading to excessive cost and energy use.

With the forgoing problems and concerns in mind, the present invention therefore seeks to utilize a memory apparatus which allows for very fast character strings searches, insertions and deletions, wherein a new type of memory storage circuit called a Connex Memory (hereinafter, CM) is utilized.

In particular, the present invention proposes a Connex Memory device that operates in the manner of an associative memory, yet which includes a flexability not heretofore known in associative memory devices.

Known data processing systems most often utilize conventionally addressed memory devices. That is, known data systems utilize memory devices which include defined locales therein, each locale having its own particularized address. In this manner, should a system processor desire to add the value stored at address A with the value stored at address B, the conventional memory device will proceed to the specific, addressed locations, or cells, within the memory device, and communicate these values, via an interface, to the processor where the appropriate summation can occur. In such systems, the nature and capability of the integral components, that is, the nature and capabilities of the processor and the memory devices, are well defined and distinct from one another.

It is also known that data processing systems may include more than one processor and memory device, and further, that these multiple components may be part of a system that executes multiple streams of instructions. These multiple instruction streams, multiple data streams (MIMD) devices can be viewed as large collections of tightly coupled SISD devices where each processor in the system, although operating in overall concert with the other integrated processors, is responsible for a specific portion of a greater task. That is, the effectiveness of MIMD devices is typically limited to those specified arenas where the problem to be solved lends itself to being parsable into a plurality of similar and relatively independent sub-problems. The nature and capabilities of those integral components of MIMD devices are also well defined and distinct from one another.

Another known data processing system involves single instruction, multiple data streams (SIMD) devices. These SIMD devices utilize an arbitrary number of processors which all execute, in sync with one another, the same program, but with each processor applying the operator specified by the current instruction to different operands and thereby producing its own result. The processors in a SIMD device access integrated memory devices to get operands and to store results. Once again, the nature and capabilities of those integral components of a SIMD device are well defined and distinct from one another in that computations are executed by the processors that must have some type of access to a memory device to do their job.

While known data processing systems are therefore capable of processing large amounts of data, the defined and unchanging nature of the processors and memory devices limits the speed and efficiency at which various operations may be completed.

Thus, various architectures have also been constructed which utilize another class of memory devices which are not conventionally addressed. These memory devices are typically described as being 'associative' memory devices and, as indicated, do not catalog their respective bits of data by their physical location within the memory device. Rather, associative memory devices 'address' their data bits by the nature, or intrinsic quality, of the information stored therein. That is, data within associative memory devices are not identified by the name of their physical locations within the memory device, but rather from the properties of the data stored in each particular cell of the memory device.

A key field of a fixed, or limited, size is attached to all data stored in most associative memory devices. A search key may then be utilized to select a specific data field, or plurality of data fields, whose attached key field(s) match the search key, irrespective of their named location, for subsequent processing in accordance with directed instructions.

In these known associative memory devices, all data stored therein includes a key field and a corresponding data field. Known associative searching and data-manipulation techniques examine the key fields within an associative memory to determine which of the corresponding data fields includes data of particular interest for a predetermined command. Once identified, any data fields of continued interest may be 'tagged' or 'marked' by changing the state of one or more bits within the appropriate key field, thus leaving the associated data fields primed for subsequent searching or manipulative commands.

Therefore, known associative memory devices rely upon a controller capable of observing the content of key fields so as to identify those data fields of interest. While these known associative systems are useful to a certain degree, they still suffer from a lack of flexibility in the searching architecture, and thus their utility is correspondingly diminished while their processing time is increased.

With the foregoing problems and concerns in mind, the present invention seeks to increase the flexibility of known associative memory devices so as to increase their utility while simultaneously reducing their processing times.

SUMMARY OF THE INVENTION

It is an object of the present invention to provide an efficient data processing system.

It is another important aspect of the present invention to provide a cellular engine for a data processing system that implements an active associative memory, or associative engine device, in a manner which increases data processing speeds and efficiency.

It is another important aspect of the present invention to provide a cellular engine for a data processing system that implements an active associative memory, or associative engine device, capable of universally utilizing any cell in either the key field or the data field.

It is another important aspect of the present invention to provide a cellular engine for a data processing system that implements an active associative memory device, or associative engine, where there is no distinction between the key field and the data field of the associative memory device during the implementation of a predetermined command.

It is another important aspect of the present invention to provide a cellular engine for a data processing system that implements an active associative memory device, or associative engine, whose individual cells can selectively process, in parallel, a given instruction based upon their respective state, all within a single clock cycle.

It is another important aspect of the present invention to provide a cellular engine for a data processing system that implements an active memory device, or cellular engine, whose structure is homogeneous, thus allowing the very same piece of information stored in memory to be (part of) either the key field or data field at different times during the execution of a program.

It is another object of the present invention to provide a cellular engine for an efficient data processing system that enables the dynamic limitation of the search space within an active associative memory device.

According to one embodiment of the present invention, an associative memory support for a data processing system includes an associative memory device containing n-cells. A controller is provided for issuing an instruction to the associative memory device. A clock device outputs a synchronizing clock signal that includes a predetermined number of clock cycles per second, the clock device outputting the synchronizing clock signal to the associative memory device and the controller. The controller globally communicates the instruction to all of the n-cells simultaneously, within one of the clock cycles and the instruction is applied equally to each of the n-cells.

These and other objectives of the present invention, and their preferred embodiments, shall become clear by consideration of the specification, claims and drawings taken as a whole.

DETAILED DESCRIPTION OF THE PREFERRED EMBODIMENT

The CM is a physical support for storing strings of words each taking values from a finite set of memory symbols, each word augmented by 'setting' an additional bit, thereby marking the word with one of two states: marked or not marked. The term 'memory symbol' is interpreted herein to mean a fixedlength collection of consecutive bits, and whose length depends on the application and is not set a priori.

Figure 1:
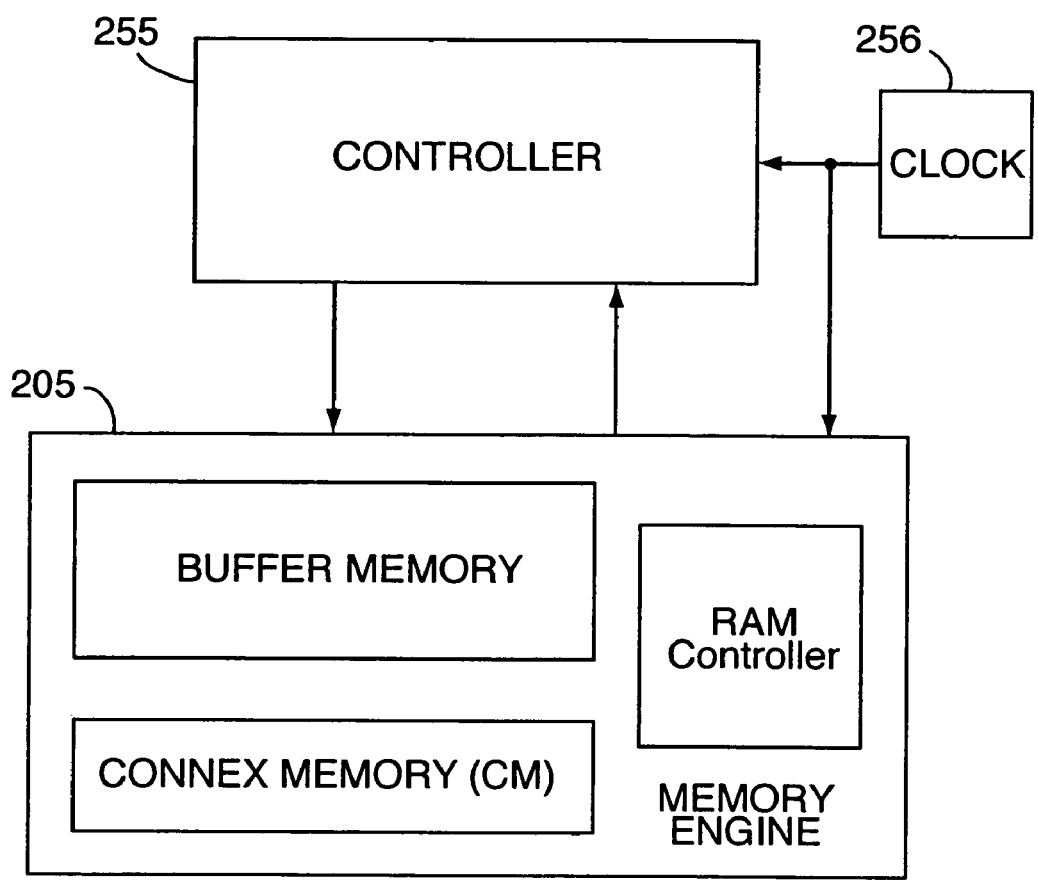
FIG. 1 is a block diagram showing the general architecture of a memory engine, including an outside controller and clock element, according to one embodiment of the present invention

The structure of the present invention allows for the execution of all the CM commands in one clock cycle with a delay of approximately twice that of the delay typically encountered in current cache memory technology. The structure described herein is that of a stand-alone circuit, which can also be replicated in a more elaborate circuit. FIG. 1 depicts the general architecture of a memory engine 205 according to one embodiment of the present invention, as well as its operational relationship with both an outside controller 255 and a synchronizing clock circuit 256. It will be readily appreciated that the operation of the outside controller 255 and the memory engine are coordinated through use of a common clock signal issuing from the clock circuit 256. Moreover, the present invention contemplates that the outside controller 255 may have any number of circuit-specific configurations without departing from the broader aspects of the present invention provided that the outside controller 255 is capable of issuing commands to, and receiving data from, the memory engine 205.

Figure 2:
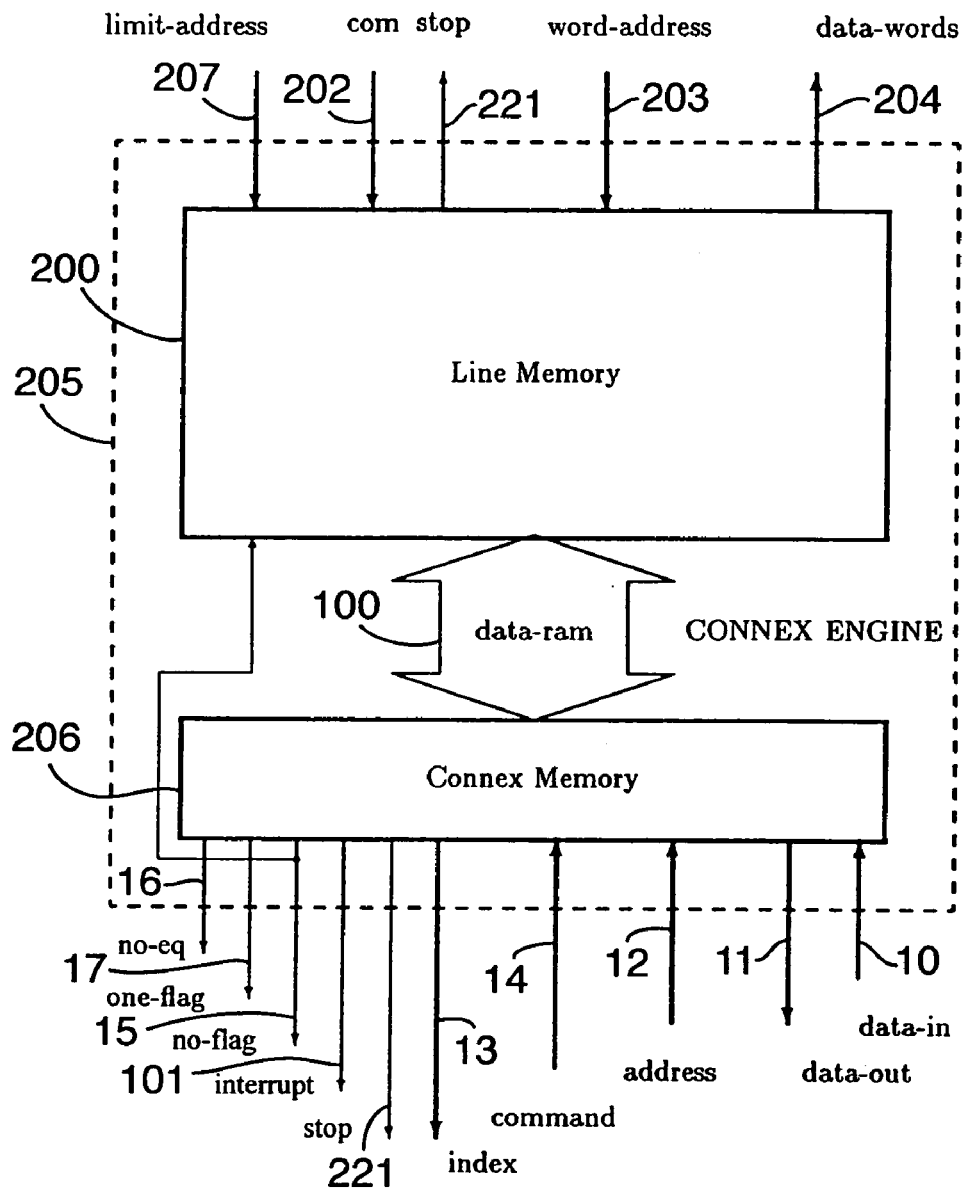
FIG. 2 is a block diagram depicting the memory engine of FIG. 1 in association with the different busses that permit the exchange of information between the constituent elements of the memory engine.

As depicted in FIG. 2, the CM 206 is associated with a Line Memory random access device 200 organized as a pool of buffers, each of which has a size equal to the size of the CM 206, and which is under the control of the memory engine 205, hereinafter referred to as a Connex Engine (CE). The purpose of these buffers, also referred to as lines, is to allow for search, insert and delete operations to be performed on character strings longer than may be accommodated within the CM 206, and to offer a lower cost of implementation and reduced power dissipation, as will be discussed in more detail later.

Figure 3:
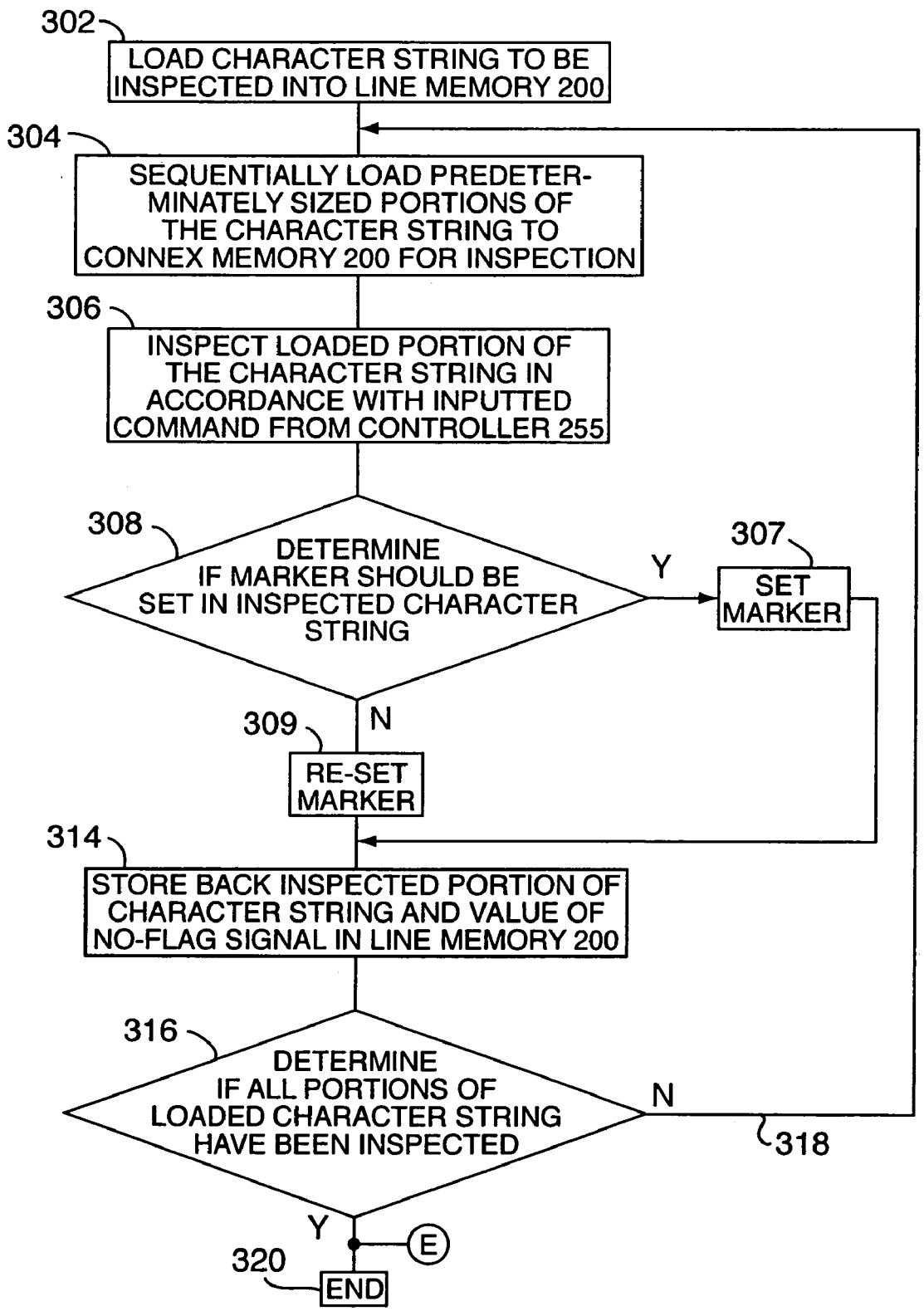
FIG. 3 is a flow diagram depicting one embodiment of the general operation of the memory engine of FIG. 1.

FIG. 3 illustrates the general application of the CE 205 beginning with block 302 where a character string, previously selected for inspection by a controller 255, is loaded into the associative line memory 206. The character string is comprised of a collection of data symbols which, for the purposes of illustration, are loaded into one or more of the buffers in the line memory 200 until completely stored therein. In this manner, each buffer in the line memory 200 contains a different portion of the character string, each portion having a size equal to the size of the CM 206, as discussed previously.

As shown in block 304 of FIG. 3, the CE 205 loads the contents of the first buffer to be inspected from the line memory 200 to the CM 206, via a data RAM bus 100. The CM 206 then performs the desired string operation, or inspection, of the loaded portion of the character string, in accordance with an inputted command from the controller 255, as depicted in block 306. The CM 206 then determines if one or more data markers should be set in the inspected portion of the character string in block 308, selectively setting such a marker in block 307 and re-setting the marker in block 309. It will be readily appreciated that the determination as to whether one or more data markers should be set within a given portion of the character string which has been shifted to the CM 206 will depend on the specific command inputted by the controller 255, as will be discussed in more detail later.

After inspecting the portion of the character string in the CM 206 and, if necessary, setting one or more markers therein, the CE 205 then stores the contents of the CM 206 back in the first buffer of the line memory 200, loads the contents of the second buffer and performs the same operation. The CE 205 continues the pattern of loading a buffer into the CM 206, string-processing in the CM 206, and storing the contents of the CM 206 back to the buffer, until the whole character string has been processed. Because of the level of locality present in the string of symbols searched, the number of buffers loaded into the CM 206 quickly decreases as the number of search operations progresses, quickly limiting the bulk of operations to a small number of buffers.

It is therefore an important aspect of the present invention that the entirety of the character string data stored in the buffers of the line memory 200 need not be repetitively inspected in response to a command issued from the controller 255 as the presence (or absence) of set markers enables certain buffers to be eliminated from subsequent review. For example, if the command issued by the controller 255 instructs a search for a given set of data elements (as will be described in more detail later), the CM 206 will first go through each of the character strings in each of the buffers in the line memory 200, setting markers where appropriate as it searches for the first of the data elements. Subsequent inspection of the buffers in the line memory 200 will then be restricted to those buffers which include a set marker, while excluding those which do not have a set marker. In this manner, the CM 206 of the present invention need not repetitively search those buffers which cannot possibly include all components of the data elements to be searched, thereby significantly and progressively eliminating the review of large amounts of data and thus speeding response time.

It is another important aspect of the present invention that the CM 206 is capable of performing a number of operations in parallel with one another, all within one clock cycle. Therefore, with respect to FIG. 3 and blocks 306, 307, 308 and 309 in particular, the CM 206 enables the parallel processing of these blocks in a single clock cycle. It will thusly be readily appreciated that the individual blocks contained with FIG. 3, as well as the other block diagrams of the present invention, are not to be interpreted as being temporally sequential in their execution, rather the CM 206 enables the parallel processing of many blocks in a single clock cycle, as discussed previously.

The next sections describe the operations of the CM 206 and the operation of the CE 205 in greater detail, in association with specific commands issued by the controller 255.

The CM 206 operates by receiving commands and data, typically from the controller 255. When commands require a data operand, such as a 'find' command which locates all the occurrences of a given symbol, or data element, in a character, or symbol, string currently stored in the CM 206, both the command and the symbol are fed to the CM 206 at the same time. The CM 206 supports several types of commands, divided into two main categories: forward commands, and reverse commands. Each group contains three types of commands: commands that set or reset the markers associated with the cells, commands that access words stored in cell whose marker is set, and commands that modify the word stored in a cell whose marker is set. Although the present design sports a one-bit marker associated with each storage word, several bits can be used to code the state of each word without departing from the broader aspects of the present invention.

We first describe commands belonging to the forward-command group. The instructions in the reverse group behave in a mirror-image fashion, as described later. In the discussion that follows, the term symbol represents any logical block of bits. For some applications, 8-bit bytes can be the preferred implementation. In others, such as biological processing of genomic strings, symbols can be 4-bit entities.

Forward Commands

For string search and insert operations, an input data string is fed to the CM 206 one symbol (e.g. character) at a time along with a command. When the command is a search, each symbol is simultaneously compared to all the symbols currently stored in the CM 206. Two types of comparisons, conditional and unconditional, can be performed. The first symbol of a string is searched unconditionally, while subsequent symbols are searched conditionally on the previous symbol having been found in the CM 206.

When the operation is an insert, the symbols in the CM 206 on the right hand-side of the insertion point are shifted right by one location, and the new symbol is stored at the insertion point. In one embodiment of the present invention, the insertion point is the location of the first symbol with a marker set.

It is another important object of the present invention that the search and insert operations operate both in one clock cycle only, owing to efficiency of the CE 205 system architecture, as discussed previously.

With string delete operations, successive symbols are read from the deletion point in the CM 206, and all the symbols on the right side of this point are shifted left by one position. Here again, the deletion point is the location of the first or last storage cell with a set marker. The read and shift components of this operation are done simultaneously and take one clock cycle only.

A description of the commands implementing the above operations will now be explained.

Figure 4:
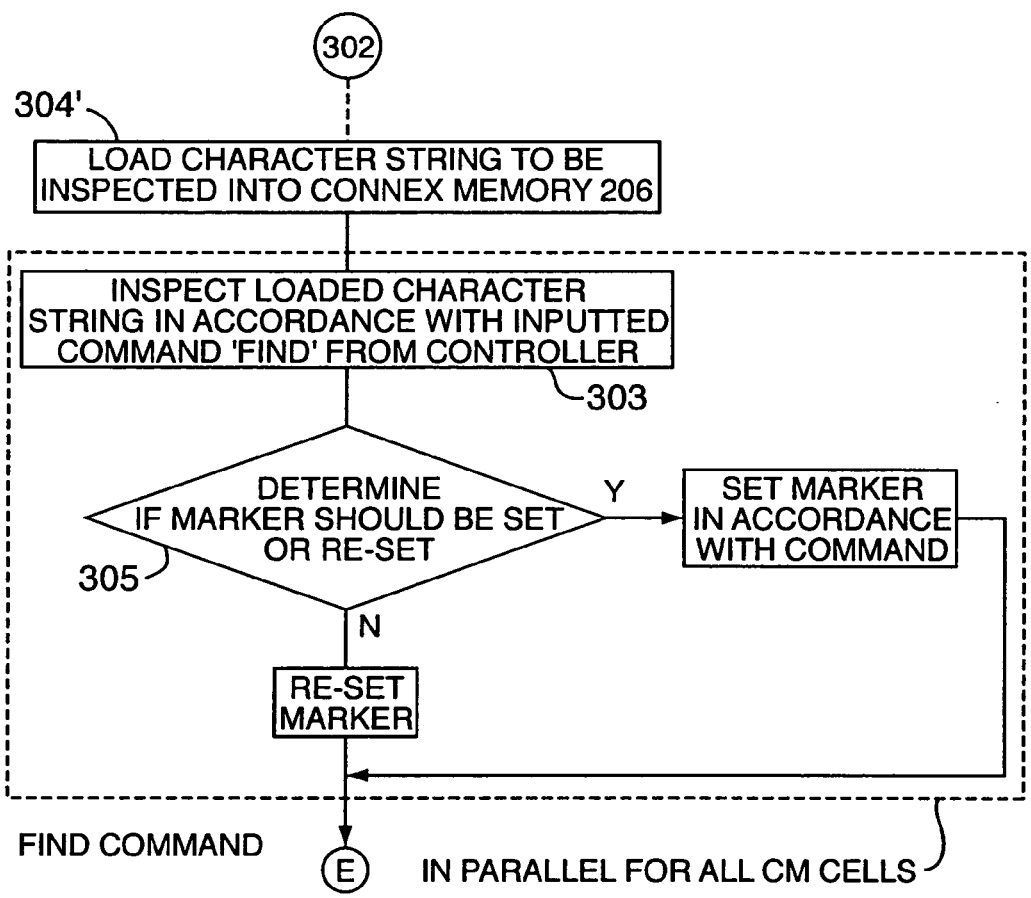
FIG. 4 is flow diagram depicting another embodiment of the general operation of the memory engine of FIG. 1.

The find and cfind commands are access commands. As depicted in the flow diagrams of FIGS. 3 and 4, the Find command may be fed to the CM 206 via the controller 255 along with a symbol which the CM 206 associatively compares to all the symbols contained in its M memory cells. The result of this command is that the markers of all the cells following a cell whose contents match the given symbol are set. All the other markers are reset. While FIG. 3, blocks 302–314 illustrate the execution of all commands in general terms, FIG. 4, blocks 304', 303 and 305 illustrate the specific implementation of the find command in those cases where the loaded character string may be accommodated in its entirety within the CM 206 (hence step 304 in FIG. 3 and corresponding step 304' in FIG. 4), as discussed in more detail later and in accordance with another embodiment of the present invention. As also illustrated in FIG. 4, the execution of the find command occurs within a single clock cycle, with reference letter E indicating the return to the general flow diagram of FIG. 3 after execution of the find command of FIG. 4. For example, assume that the present invention represent a symbol whose marker is set by putting brackets around it, and assume further that the string "RON AND ROBERT" is currently stored in the CM 206. The result of issuing the command find(R) to the CM 206 makes its contents change to "R[O]N AND R[O]BERT". The markers of the two O symbols get set because they both follow a cell containing 'R', which is the symbol to be found, as depicted in block 308 of FIG. 3.

Figure 5:
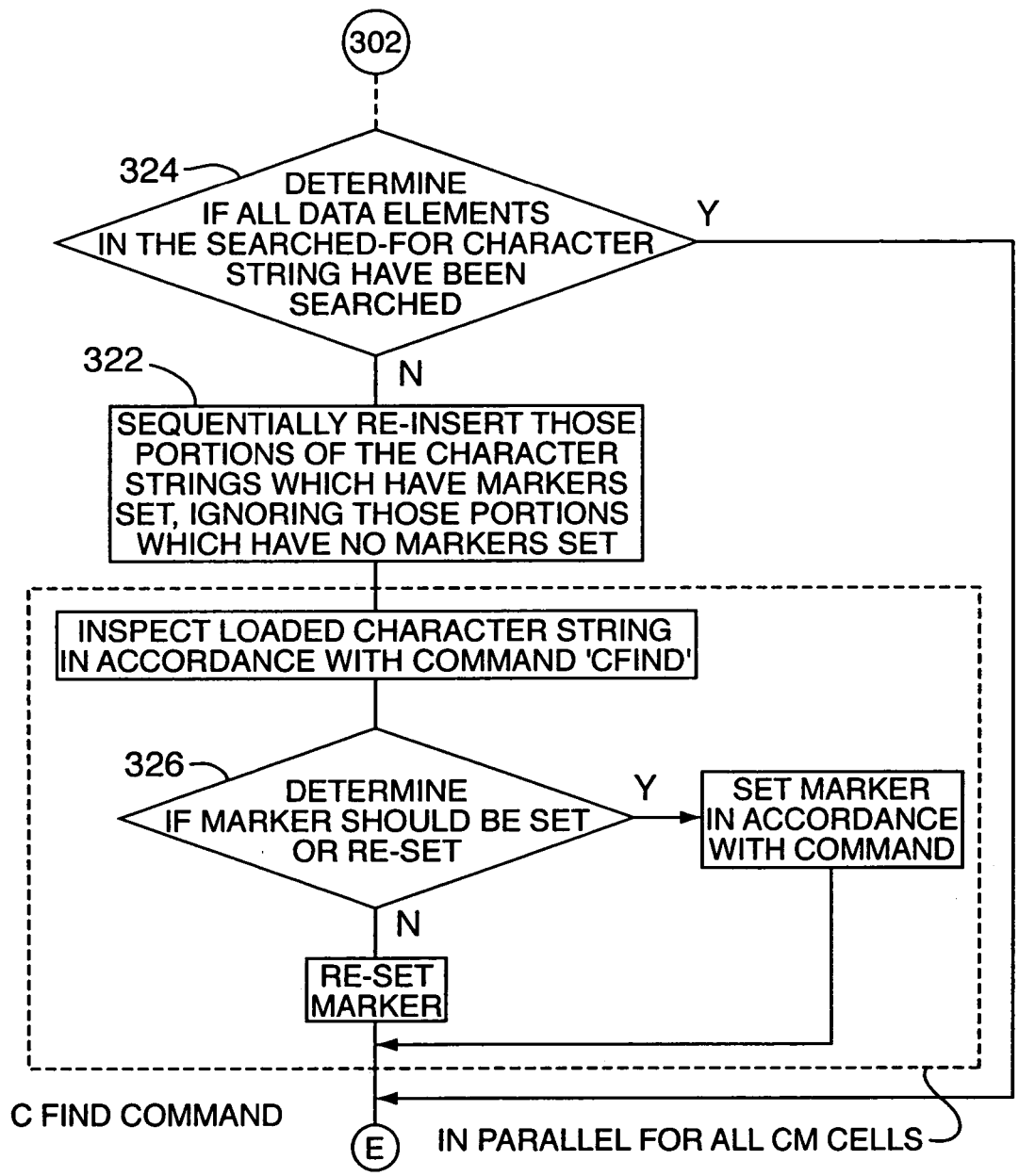
FIG. 5 is a flow diagram depicting the processing of a 'c-find' command by the memory engine of FIG. 1.

The cfind command, for "conditional find", works similarly to find, in that a symbol is also fed to the CM 206 along with the command, and the CM 206 performs an associative search of this symbol, but in this case, only cells, or buffers of the line memory 200, that have a marker that is previously set are involved in the comparison, as depicted in FIG. 5 block 322. The result is that cells that follow a cell where a match occurs get their markers set. All the other markers get reset. Using the same example as above, and assuming that both 'O' symbols still have their marker set, then the command cfind(O) will restrict the associative comparison to only the marked cells. Since both of them contain 'O', then both comparisons are successful, and the marker of the cells to the right of the cells containing 'O' get their marker set: "RO[N] AND RO[B]ERT". Assume that cfind(B) is now executed, then only the second marked cell sees a successful comparison, and the marker of the E symbol gets set: "RON AND ROB[E]RT". This process continues until all symbols, or data elements, have been searched for whereby successful (or, alternatively, non-successful) matches are output to the controller 255, as depicted in blocks 324–326 of FIG. 5.

As explained herein, it will be readily appreciated that FIG. 3 depicts the basic functioning of the present invention, generally applicable to all of the inputted commands. Therefore, the 'character string' described in connection with, e.g., block 302 may contain one or more data elements in dependence upon the nature of the issued command and the specific data being manipulated or inspected. Moreover, although FIG. 3 assumes that the loaded character string is larger than could be accommodated in the CM 206, thus requiring piecemeal shifting of the same from the line memory 200 to the CM 206 for inspection, this may not always be the case. As depicted in FIG. 4, an alternative method includes loading those character strings having a size capable of being accommodated by the CM 206 directly into the CM 206, as shown in block 301. Inspection of the character string loaded into the CM 206 will then be accomplished in block 303, in accordance with the specific command, while block 305 will set or re-set markers as appropriate.

It will readily be appreciated that by selectively bypassing the CE 205 and the line memory 200 in those situations where the CM 206 can accommodate the data to be inspected, processing time and expended energy may be correspondingly conserved.

Another proposed command is the read-forward command. The read-forward command makes the CM 206 return the symbol stored in the first, i.e. the left-most, cell which has a marker set. In the presented scheme, according to accepted practice, the left-most symbol of the CM 206 has Address 0, and the right-most Address M-1, assuming a storage capacity of M symbols.

Figure 6:
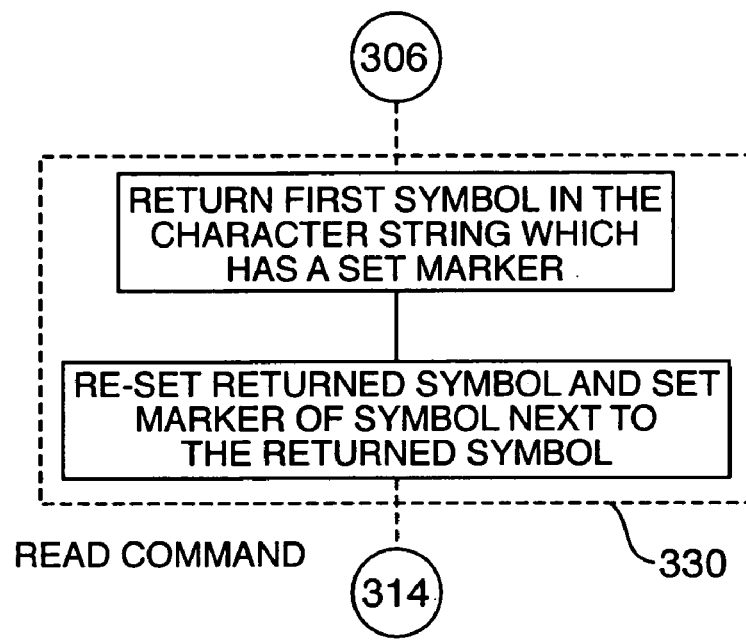
FIG. 6 is a flow diagram depicting the processing of a 'read' command by the memory engine of FIG. 1.

As soon as a read operation is performed, the marker of the cell just read is reset, and the marker of the cell next to the one just read becomes set. Assume that the CM contains "RO[N] AND RO[B]ERT" again. The result of a read-forward command is the output by the CM of the symbol 'N', and the left-most marker changing as follows: "RON[ ]AND RO[B]ERT". The space symbol is now marked. FIG. 6 illustrates this process as block 330, the operation of which may be included in FIG. 3's block 308 when a read-forward command is issued.

Figure 7:
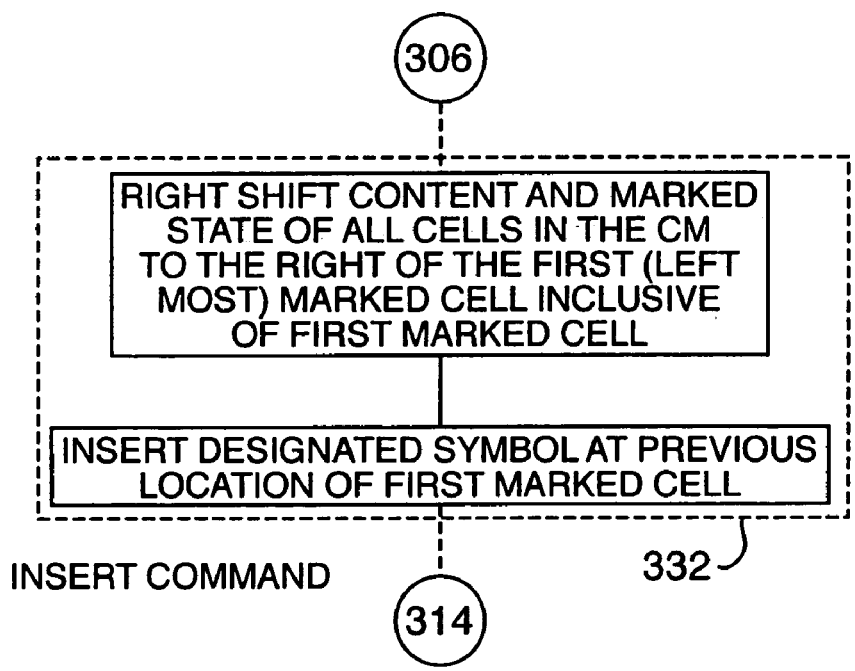
FIG. 7 is a flow diagram depicting the processing of an 'insert' command by the memory engine of FIG. 1.

Another proposed command is the insert command. The insert command is applied to the CM 206 along with a symbol X. This command takes effect only on the first, or left-most, marked cell of the CM 206. When the symbol X is inserted, the contents and state of all the cells to the right of the first marked cell, including the markers, are shifted to the right by one position, and the symbol X is stored in the previous location of the first marked cell. The marker of the cell that just received the new symbol is reset. The marker of the cell that is directly to the right of this cell gets set. As an example, assuming that the CM 206 contains "R[O]N AND R[O]BERT", then insert(X) will cause the contents of the CM 206 to "RX[O]N AND R[O]BERT". FIG. 7 illustrates this process as block 332, the operation of which may be accomplished in FIG. 3's block 308 when an insert command is issued, and the character string is larger than may be initially accommodated within the CM 206.

Figure 8:
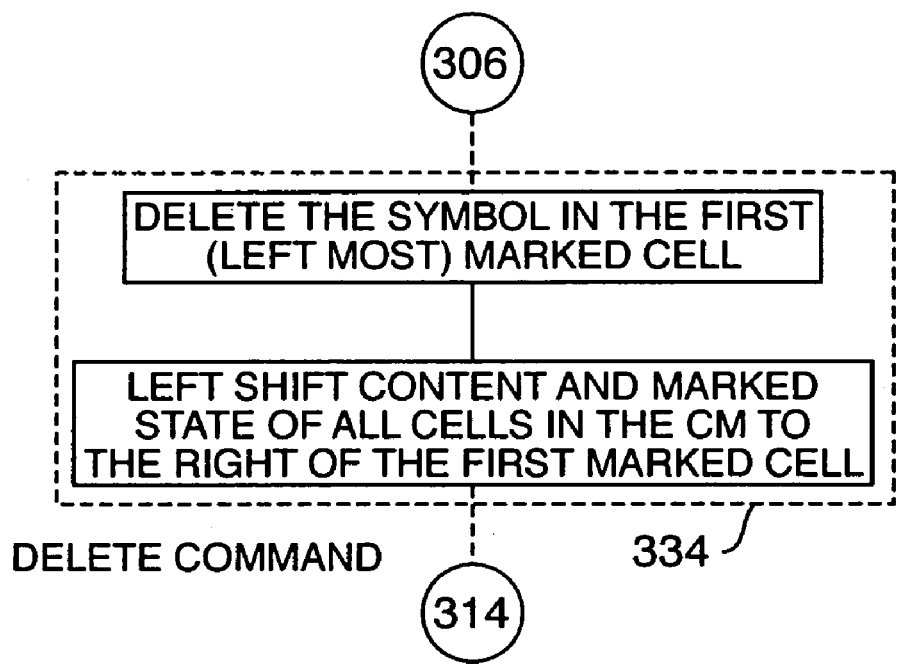
FIG. 8 is a flow diagram depicting the processing of a 'delete' command by the memory engine of FIG. 1.

Another proposed command is the delete command. The delete command works by removing the symbol stored in the first marked cell, and by shifting left all the contents of all cells to the right of this cell. Assuming that the CM contains "RO[N] AND RO[B]ERT", then after the delete command takes effect, the CM contains "RO[ ]AND RO[B]ERT". FIG. 8 illustrates this process as block 334, the operation of which may be accomplished in FIG. 3's block 308 when an delete command is issued, and the character string is larger than may be initially accommodated within the CM 206.

Figure 9:
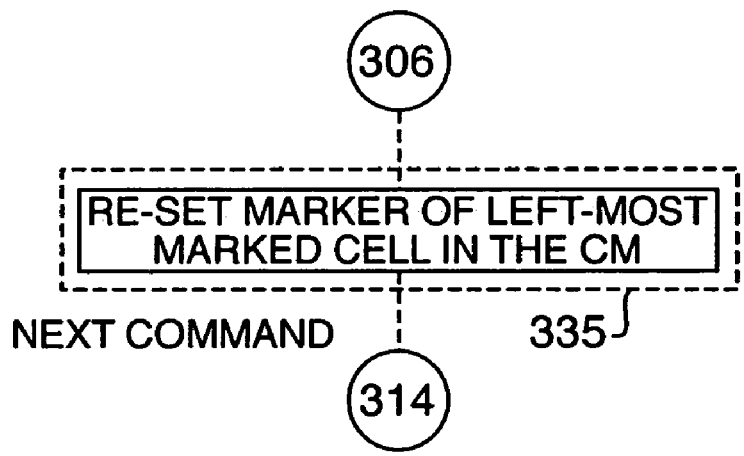
FIG. 9 is a flow diagram depicting the processing of a 'next' command by the memory engine of FIG. 1.

Another proposed command is the next command. The next command does not have a parameter, and resets the marker of the first, or left-most, marked cell. This way, when several markers are set, this command can be used repeatedly to allow access to all the marked cells of the CM 206. For example, assuming that the CM 206 contains "R[O]N AND R[O]BERT", the execution of next changes the contents of the CM 206 to "RON AND R[O]BERT". FIG. 9 illustrates this process as block 335, the operation of which may be accomplished in FIG. 3's block 308 when a next command is issued, and the character string is larger than may be initially accommodated within the CM 206.

Returning briefly to FIG. 1, the index output 13 carries the linear address of the first marked cell in the CM 206. For example, if the first, or left-most, cell of the CM 206 has its marker set, then index returns 0. If it is the second cell that is marked, then index returns 1. Assuming that the CM 206 contains the string "RO[N] AND RO[B]ERT", and that the string "RON" is stored in the left-most cells of the CM 206, then index returns 2, since the symbol 'N' is stored at Address 2 in the CM 206.

Another proposed command is the write-one command. The write-one command is applied to the CM 206 along with a symbol S, which is written to the first or left-most marked cell of the CM 206. The marker of this cell is reset, and the marker of the cell that linearly follows is set.

Another proposed command is the write-all command. The write-all command is applied to the CM 206 along with a symbol S which is written simultaneously and in one clock cycle to all cells of the CM 206 that have a set marker. The markers of these cells are reset, and the markers of the cells that follow these cells are set.

Another proposed command is the write command. The write command is applied to the CM 206 along with an address A and a symbol S, which is stored in the cell of the CM 206 of address A. This command is similar to a write operation in a random-access memory. The marker associated with the cell of Address A is reset, and the marker of the cell that follows linearly is set.

The read command is applied to the CM 206 along with an address A, and makes the CM 206 output the contents of its cell located at Address A. This command is similar to the read operation of a random-access memory. The marker of the cell accessed by this operation is not modified.

Another proposed command is the jump command. The jump command is applied to the CM 206 to address those situations where character strings of varying lengths are stored in the CM 206, with identical prefixes and suffixes (i.e. same sequence starting the two strings, and same sequence ending the two strings), but with different mid sections, which can be of different length, and furthermore if the last symbol of the prefixes of all the strings are marked, then the CM 206 supports an operation called jump which takes one operand, and whose behavior is best illustrated by an example.

Assume the CM 206 contains two strings in different parts of its storage: "AAA%BB%CCCC" and "AAA%DDD%CCCC", where '%' represents a unique symbol used as a delimiter for the particular application at hand. Assume furthermore that the markers associated with the '%' following the AAA prefixes have been set, for example by executing the commands find(A), cfind(A), cfind(A): "AAA[%]BB%CCCC", and "AAA[%]

DDD%CCCC". The purpose of the jump(s) command, where s is a symbol, is to migrate the markers from their present location to the unmarked '%' symbols starting the CCCC suffixes, and then to replace them by the s-symbol.

Figure 10:
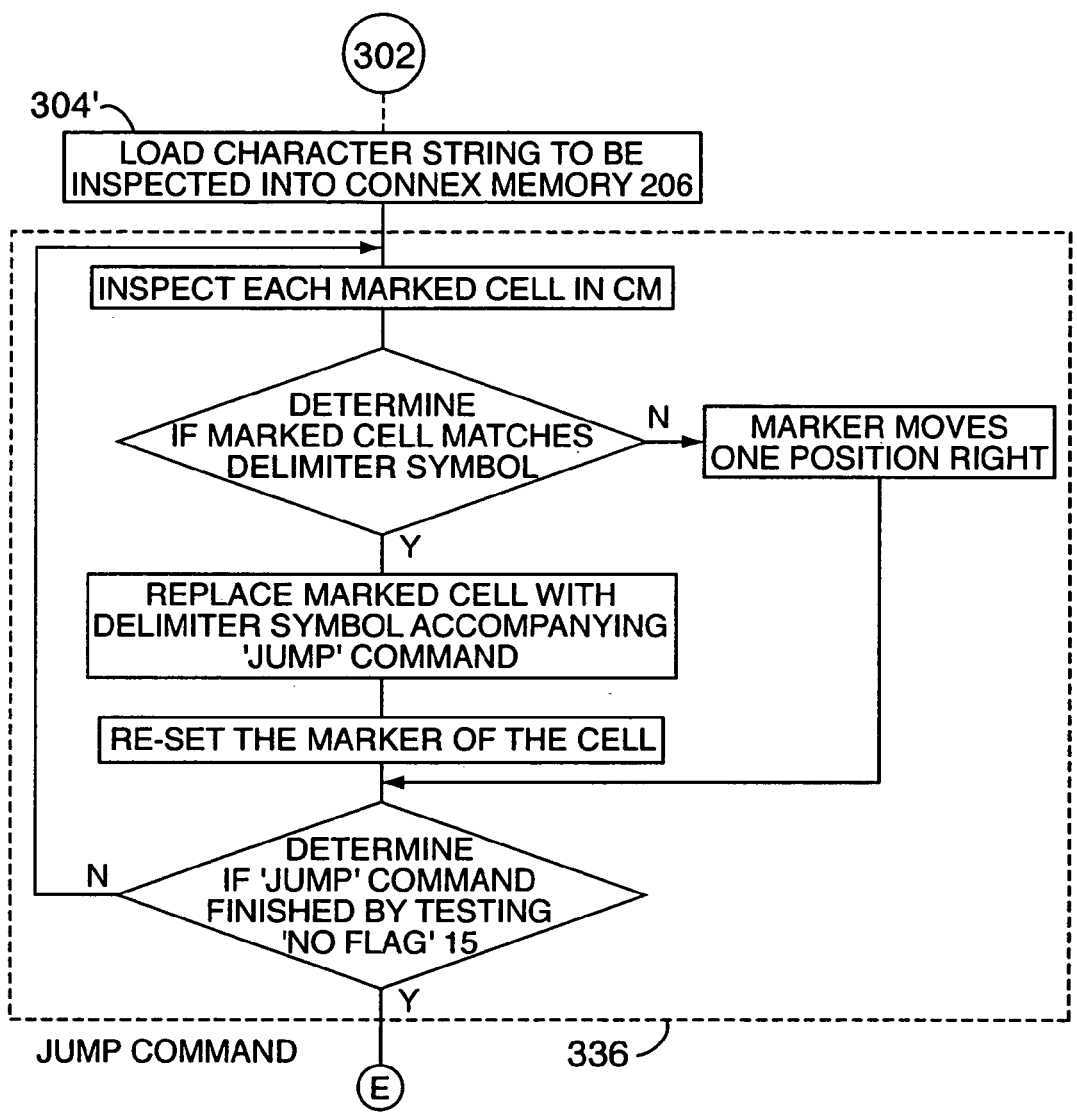
FIG. 10 is a flow diagram depicting the processing of a 'jump' command by the memory engine of FIG. 1.

For example, after the first instantiation of the command jump($), the two strings in the CM 206 example above will have changed as follows: "AAA%[B]B%CCCC" and "AAA%[D]DD%CCCC". After issuing the second jump($) command, the strings become "AAA%B[B]%CCCC" and "AAA%D[D]D%CCCC". After a third jump($): "AAA%BB$CCCC" and "AAA%DD[D]%CCCC". After a fourth jump($): "AAA%BB$CCCC" and "AAA%DDD$CCCC". Hence, in response to the jump command, the CM 206 executes the following action: All cells whose marker is set compare their symbol to the special delimiter symbol (%-sign in our example). If a match is found, then replace the special delimiter by the symbol s provided with the command ($-sign in our example), and reset that cell's marker. Otherwise, if a match didn't occur, then reset the marker of the cell and set that of the cell directly to the right, in effect making the marker move one position to the right. FIG. 10, block 336, illustrates the specific implementation of the jump command in those cases where the loaded character string may be accommodated in its entirety within the CM 206 (hence step 304 in FIG. 3 and corresponding step 304' in FIG. 10), with reference letter E indicating the return to the general flow diagram of FIG. 3 after execution of the jump command of FIG. 10.

The jump command is important in database applications, where strings of symbols contain pairs of field identifiers, or delimiters, and data values, where the identifiers have fixed lengths, but the fields containing the data values do not. In this manner, the present invention advantageously provides a method for inspecting fields within a character string, each field containing randomly sized data values, while marking specific data fields in the character string irrespective of their content. Moreover, as each comparison of the marked cell in the character string is accomplished in one clock cycle, the inspection of the character string may be completed in a quick and efficient manner.

It is another important aspect of the present invention that the jump command replaces the delimiter symbols in a character string with a predetermined locator symbol. The locator symbol may therefore be utilized to mark the end of a specific data field regardless of length, or alternatively, may be utilized to enable the marking of a data field which follows a searched-for data field.

As described above, the jump command allows for the parallel inspection of a plurality of character strings stored in the CM 206, therefore permitting parallel identification of delimiter symbols in each of the character strings where each identification, and selectively substitution, of the delimiter symbols occurs in a single clock cycle.

Reverse Command

The search, insert, and delete mechanisms described so far always apply to the first marked cell of the CM 206, and, when they affect other cells, affect those on the right hand-side of the first marked cell. The CM 206 also supports backward or reverse find, insert, delete, next and index operations, where the operations apply to the last marked cell of the CM 206. Their behaviors mirror those of the forward find, insert, delete, next and index operations described above.

A Reverse-find command is a command that is fed to the CM 206 along with a symbol s and it sets the marker of the cells to the left of a cell containing the symbol s. All other markers are reset. If the CM 206 contains "JOHN AND JOHNNY", then reverse-find(N) sets the markers as follows: "JO[H]N [A]ND JO[H][N]NY".

A Reverse-cfind, command is a command for reverse conditional-find, is fed to the CM 206 with a symbol s, and the CM 206 associatively searches only the marked cells. All such cells that contain a copy of the symbol s have the marker of their left neighbor cell set. All other markers are reset. Assuming the CM 206 contains "JO[H]N [A]ND JO[H][N]NY", reverse-cfind(H) changes the markers as follows: "J[O]HN AND J[O]HNNY".

A Reverse-insert command is a command that is fed to the CM 206 along with a symbol s. The contents of the left-most marked cell and all the cells to its linear right are shifted right by one, and the symbol s is stored in the left-most marked cell. The marker of this cell does not change. For example, reverse-inserting 'X' in "JO[H]N AND JO[H]NNY" results in the new CM 206 contents: "JO[X]HN AND JO[H]NNY".

A Reverse-delete is a command which operates by reading, or removing the symbol in the left-most cell and shifting left the contents of all the cells to its right by one. The marker of the left-most marked cell is reset, and that of the cell to its left is set. For example, if the CM 206 contains "JO[H]N AND JO[H]NNY", then the result of reverse-delete is "J[O]N AND JO[H]NNY".

Limited-Range Commands

As indicated previously, the CM 206 also supports operations that affect only the cells whose address is larger than some number which can be set by two additional commands. Commands whose domain of operation is limited to cells that have addresses larger than the limit are referred to as limited commands. In this case the scope of the search, insert, and delete operations is not the whole M words in the CM 206, but a smaller section of it. In this case, when a find, cfind, insert, or delete operation is performed, only the cells in a contiguous block of cells of the CM 206 are affected. This block of cells is delimited on the left by a special address register located in the address decoding section of the CM 206, and extending to the very last, i.e. right-most, cell of the CM 206.

A Set-limit is a command that sets the lower limiting address for limited command to the address of the first, or left-most marked cell. For example, if the CM 206 contains the string "RO[N] AND RO[B]ERT", then the set-limit command sets the limiting address to 2, since the left-most marked symbol is 'N', at Address 2 in the CM 206.

A Set-limit-address is a command that is applied to the CM 206 along with an address A, and that stores this address in the internal storage where the limiting address is kept.

Limited-find, limited-cfind, limited-reverse-find, and limited-reverse-cfind are limited commands that work similarly to the find, cfind, reverse-find, and reverse-cfind commands, but only apply to cells whose address is greater than or equal to the limiting address.

The limited-write-all command is applied to the CM 206 along with a symbol s, and works in a manner consistent with the write-all command. It writes the symbol s in all the marked cells whose address is greater than or equal to the limiting address.

Several boolean signals are output by the CM 206 reflecting the status of its marked cells.

1) One signal is set to 1 by the CM 206 if there is a least one marked cell in the CM 206, and 0 otherwise.

2) One signal is set to 1 by the CM 206 if there is exactly one marked cell in the whole CM 206, and is set to 0 otherwise.

3) One signal is set to one if the last conditional-find type command (forward, reverse, or limited) was unsuccessful (no markers set), and the CM 206 automatically reverted to a find-type operation, which may have set some markers.

4) One signal is set to 1 by the CM 206 if one or several characters with a predetermined binary pattern get their associated markers set. These characters are used to represent empty or invalid symbol locations, and their markers being set by an operation represents an extraordinary condition that must be addressed by the outside controller 255.

5) One signal is set to 1 by the CE to indicate that none of the buffers contain symbols with set markers, or that the RAM controller has loaded all the buffers in the CM, and that no buffers are left to be loaded.

The Connex Engine

As mentioned previously, the Connex Engine (CE) 205 is illustrated in FIG. 2. It is a circuit that manages strings of symbols stored in the CM 206 and in the buffers of the line memory 200, also referred to as lines, implemented with random-access memory. Each line has a capacity equal to that of the CM 206, and contains M words of (N+1) bits. The CE 205, under control from an outside entity such as a computer or processor, allows the exchange of the full contents of the CM 206 to be written to or read from a line memory 200 (LM) containing lines, or buffers. A write operation stores the contents of a line into the CM 206. A read operation stores the contents of the CM 206 in a line. Both operations take one cycle. The outside processor can write information into the CM 206 using the insert, or write commands, and feed symbols through the data-in bus 10. Symbols can be read from the CE 205 through two paths: one is through the CM 206, by issuing read commands on the command lines 14, for example, and grabbing symbols on the data-out bus 11. The other path is to read words containing from one to several symbols, depending on the implementation, directly from the lines in the LM 200. In this case the address of the word is sent to the CE 205 through the word-address bus 203, and the words obtained from the data-words bus 204. The data-ram bus 100 allows the contents of the CM 206 to be stored in or read from a given line of the LM 200. This bus contains M*(N+1) wires and allows the whole CM 206 to be read or written in one clock cycle.

Figure 16:
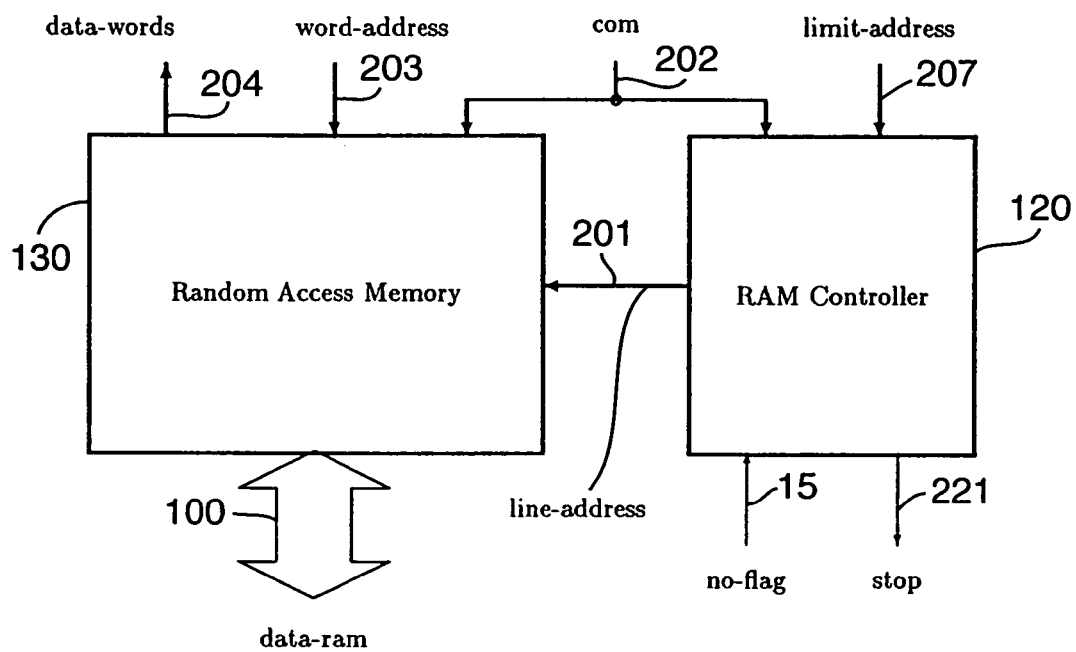
FIG. 16 is a circuit diagram illustrating the contents of a buffer memory as a combination of Random Access Memory (RAM) and a RAM controller.

FIG. 16 shows a block diagram of the two components that form the LM. One is a random access memory (RAM) 130 where the lines are stored, the other one is a RAM controller 120. The purpose of the RAM controller is to rapidly feed lines to the CM 206, so that the string of symbols stored in the collection of lines in the RAM can be quickly processed. To do this, the RAM controller executes a pass through the RAM, where it scans the collection of lines stored there and sends a selected subset to the CM 206 for processing. The RAM controller keeps two bits of storage for each line in the RAM. The first bit indicates whether the line it is associated with should be sent to the CM 206 during the current pass. The RAM controller automatically and in constant time generates the successive addresses of lines whose first bit is set to 1, and allows their contents to be stored in the CM 206 for processing, and written back from the CM 206. When a line just processed by the CM 206 is stored back in the RAM, the value of the no-flag signal 15 is stored in that line's second bit managed by the RAM controller. When the current pass is over, the RAM controller copies the value of all the second bits associated with all the lines into their associated first bit. This new collection of bits indicates what lines have markers set and should be processed in the next pass.

In cases where not all the lines in the RAM contain valid information, but only a small part, where all the lines are stored contiguously, and starting at Line Address 0, the address of the last valid line can be specified to the RAM controller to limit its initial pass to the group of valid lines. This address is fed to the RAM controller by an outside processing device using the limit-address 207 signals.

The collection of L lines of LM 200 can be implemented on the same silicon chip that contains the CM 206, or outside the silicon chip using off-the-shelf memory circuitry. In both cases, the CE 205 is used to manage the information stored in the L lines by bringing information stored in the lines into the CM 206 where string commands such as the ones described in the previous sections are performed, bringing the contents of the CM 206 back into the lines, allowing string operations to be performed in strings much longer than the M-symbol storage capacity of the CM 206.

When insert and delete operations are required, the lines are not filled to capacity with symbols, but only partially, to allow expansion and contraction of the strings of symbols in the CM 206 under these operations. In such cases, the cells of the CM 206 that do not contain valid symbols are initialized with a predetermined binary pattern not found in the string being processed. The CM 206 generates a signal for the outside processing entity called interrupt, and labeled 101 in FIG. 2. This signal is activated when one or several cells of the CM 206 containing this special binary pattern get their marker set.

The CM 206 and its External Connections

We differentiate between two type of connections. One type corresponds to the interconnection of the CM 206 with its environment, the other type corresponds to signals needed for the expansion of the circuit, i.e. if multiple CM 206 circuits are connected together to increase the amount of storage.

In the following presentation we assume that an elementary CM 206 block can store M words of memory, and that each word is N+1 bits in length, N bits for the symbol and one bit for the marker.

Figure 11:
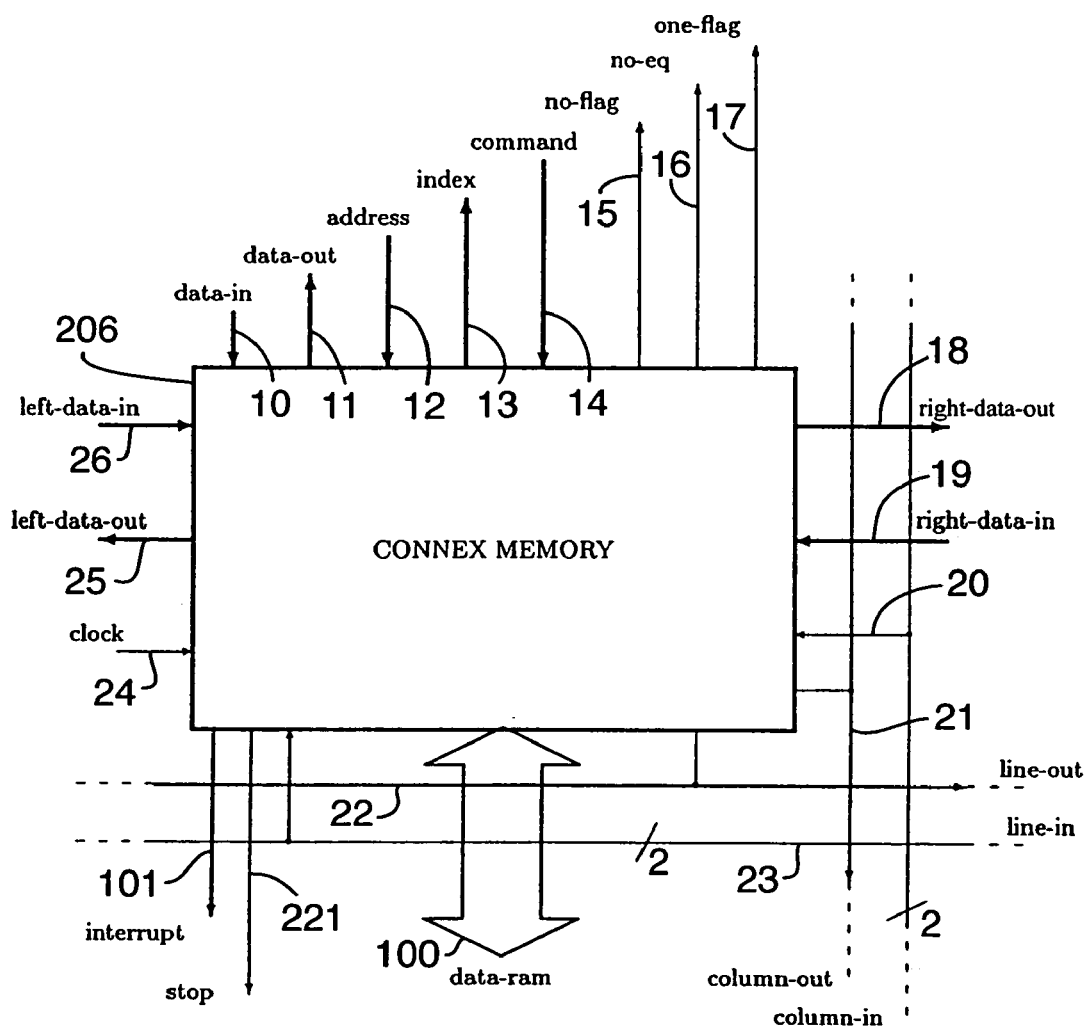
FIG. 11 is a block diagram showing the input and output signals required to interface a memory device of the memory engine to its environment, and necessary to connect several memory devices together.

The system connections of the CM 206, as shown in FIG. 11, are listed below. The number in parentheses, when present, represents the number of bits for each signal. When a log function is used, it is assumed that it is the logarithm base 2.

Data-in (M): data input 10 of N-bit words for input of symbols in the CM 206.

Data-out (M): data output 11 of N-bit words for reading symbols from the CM 206.

Address (log(N)): address input 12 of log(N) bits, where log( ) is the logarithm base 2.

Data-Ram: bi-directional data input 100 and output of M*(N+1) bits, allowing the contents of one of the storage buffers, or lines to be written to, or read from a line in the RAM 200.

Index (log(M)): output 13 of log(M)-bits holding the address of the first or last marked cell, depending on whether a forward or reverse operation was last performed.

Interrupt (1): this signal is generated by the CM 206 for an outside processing entity, and indicates that one or more cells containing a predefined special binary configuration used to indicate an empty or invalid condition have their markers set.

Command (5): 5-bit input 14 for the command code representing the operation to be performed by the CM 206.

No-flag (1): binary output signal 15 indicates that the CM 206 contains no marked cells.

No-eq (1): binary output signal 16 indicating that the last conditional-find family command (forward, reverse, or limited cfind) did not set any of the markers.

One-flag: binary output signal 17 indicating that the CM 206 contains exactly one marked cell.

clock: the input signal 24 for the clock signal which controls the operation of the CM 206.

The signals data-in, addr, and corn have associated set-up and hold times relative to the active clock edge. The signals data-out, index, no-flag, no-eq, one-flag become stable after a delay associated with accessing the memory. This delay is measured relative to the active edge of the clock signal.

When several CM 206 circuits, or modules, are connected together, in a one-dimensional array extending the internal shift register, several signals are used to link the CM 206 modules together, in a linear fashion. These signals are shown in FIG. 1, and are described below.

Data-left-in (N+2): the signals 26 received from the previous module and carrying the binary representation of a symbol (M bits), its associated marker (1 bit), and the output of the comparator associated with the marker (1 bit).

Data-left-out (N+2): the signals 25 generated to the previous module, and carrying the binary representation of a symbol (M bits), its associated marker (1 bit), and the output of the comparator associated with the marker.

Data-right-in (N+2): the signals 19 received from the next module, and carrying the binary representation of a symbol (M bits), its associated marker (1 bit), and the output of the comparator associated with the marker.

Data-right-out (N+2): the signals 18 generated to the next module, and carrying the binary representation of a symbol (M bits), its associated marker (1 bit), and the output of the comparator associated with the marker.

Line-in (2): two signals 23 received from the X-transcoder circuit and used for expanding the structure.

Line-out (1): the signal 22 generated for the X-transcoder circuit.

Column-in: two signals 20 received from the Y-transcoder circuit and used for expanding the structure.

Column-out: the signal 21 generated for the Y-transcoder circuit.

The last four signal groups are defined in more details in the section titled Internal Structure. If these eight connections are not used for expanding the memory, then they must be properly connected and/or terminated using conventional techniques in order to allow the proper operation of the CM 206 system.

The Internal Structure of the CM 206

Figure 12:
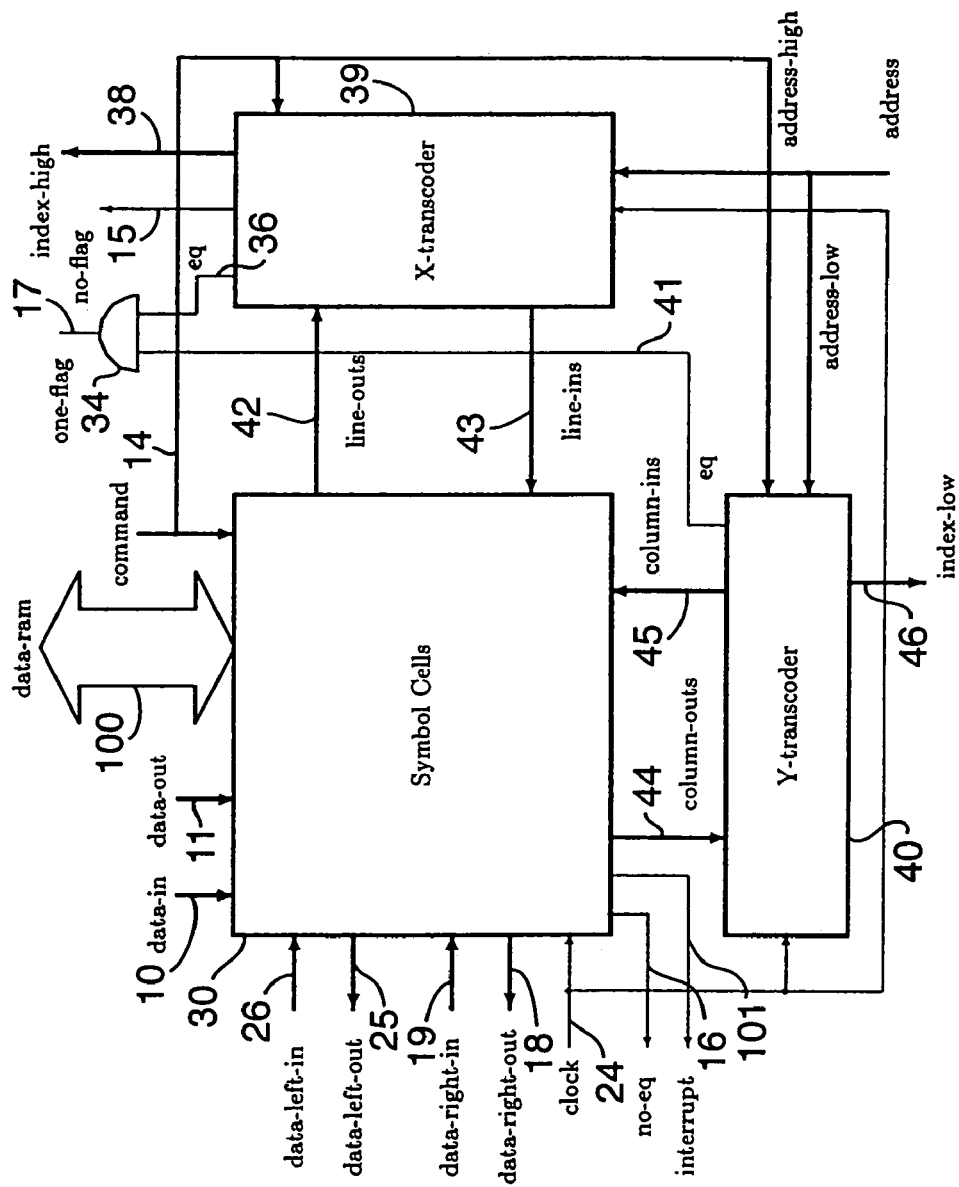
FIG. 12 is a block diagram illustrating one embodiment of the internal structure of the memory device, in which a two-dimensional array of static or dynamic memory cells is made accessible through two transcoder circuits.

FIG. 12 is a block diagram showing the two-dimensional array of cells 30 comprising the CM 206, the signals used to interface it to other CM 206 or CE 205 circuits, and the circuits allowing the selection of cells and reporting of status information about the location of marked cells. This array consists of M cells of N+1 bits organized in a two-dimensional array. The two-dimensionality is selected for two reasons. First, to maximize the use of the silicon area, and secondly, to minimize the delay associated with the propagation of the signals in the CM 206. Instead of using a typical decoder found in RAM circuit, the CM 206 uses transcoder circuits, because the addresses need to be coded, decoded and transcoded, depending on the command executed. The two-dimensional approach requires the use of two transcoder circuits, one for each dimension.

It will be readily appreciated that the CM 206 may be alternatively formed as a one-dimensional array of memory cells without departing from the broader aspects of the present invention.

The internal structure of the CM 206 as depicted in FIG. 12 contains the following subsystems:

Symbol Cells: the storage for the symbol, or dynamic memory, cells consists of a two-dimensional array 30 of M cells, one for each symbol contained in the memory (the first cell is located on the first line and in the first column of the 2-dimensional array). For the purpose of our presentation, the lines are numbered in increasing order from the bottom up in Table I (below), while the columns are numbered in increasing order from left to right.

Data-Ram: a bidirectional bus of M*(N+1) bits 100 which allows M symbols and their associated markers stored in a storage line assumed here to be located in the Symbol Cells area (30), to be written to or read from outside data storage. The selection of the lines involved in this transfer is performed by the line-select 106 signals generated by the X-transcoder circuit 39.

Interrupt: this 1-bit signal is generated by one or several cells in the CM 206 that contain a predefined unique binary pattern used to represent an empty cell or a cell containing an invalid symbol, and such that this or these cells have their associated marker set.

X-transcoder: the circuit 39 contains the logic used for addressing and accessing the cells in the CM 206, in conjunction with the Y-transcoder circuit 40.

Y-transcoder: the circuit 40 contains the logic required for the addressing and accessing of the information in the array of cells, and works in conjunction with the X-transcoder circuit 39.

A two-input AND gate: The gate 34 receives the eq signals 36 and 41 generated by the two transcoder circuits, and generates the signal one-flag 35.

The two transcoder circuits partition the contents of the CM 206 into three areas: the collection of cells located before the first marked cell, the first marked cell, and the collection of cells starting with the first marked cell.

The signals listed below operate on the internal parts of the CM 206 circuit. Because of the two-dimensionality of the array containing the M cells, and because the address of the lowest- or highest-address marked cell must be computed, the operation of the transcoder circuits rely on several key signals: line-out, line-in, column-out, and column-in.

Line-out: the line-out signals 42 are $\sqrt{N}$ in number. Each one of the line-out signals is associated with one row of the two-dimensional array of cells, and is active if that row contains a marked cell, and inactive otherwise.

Column-out: similarly, the column-out signals 44, numbering $\sqrt{N}$ in number correspond to each of the columns of the two-dimensional array of cells. A signal of the column-out group is active if its corresponding column contains a marked cell on the first active line, and is inactive otherwise.

Line-in: the line-in signals 43 are 2 $\sqrt{N}$ in number. Each row of the two-dimensional array receives two signals from the X-transcoder, line-in[1] and line-in[0], which represent the following conditions:

whether the row is the first one to contain a marked cell; and whether the row is above or equal to the first row to contain a marked cell.

For example, assume that we have an 8×8 two-dimensional array of cells with the contents shown below, and where brackets include symbols in marked cells. The numbers on the top row and first column represent the numbering system used to access the rows and columns of the CM 206, and are not symbols stored in the array.

TABLE I

|   | 0   | 1 | 2   | 3 | 4   | 5 | 6   | 7   |
|---|-----|---|-----|---|-----|---|-----|-----|
| 0 | X   | X | X   | X | X   | X | X   | X   |
| 1 | X   | X | X   | X | X   | X | X   | X   |
| 2 | X   | X | X   | X | X   | X | X   | X   |
| 3 | X   | X | X   | X | X   | X | X   | X   |
| 4 | X   | X | [X] | X | X   | X | [X] | X   |
| 5 | X   | X | X   | X | X   | X | X   | X   |
| 6 | [X] | X | X   | X | [X] | X | X   | X   |
| 7 | X   | X | X   | X | X   | X | X   | [X] |

Then the line-out signals 42, listed in order of rows 0, 1, 2, up to 7 are equal to 00001011. The line-in[1] signal of the line-in signals 43, in the same order, are 00001000, and the line-in[0] signals of the line-in signals 43 are 00001111.

Column-in 45: each column of the Y-transcoder circuit is associated with two output signals column-in[0] and column-in[1] indicating the following conditions:

whether the column contains the first marked cell of the two-dimensional array.

whether the column is equal to the column containing the first marked cell, or if it is of higher address.

Using the same example of an 8×8 two-dimensional array shown above, and listing the signals associated with the columns numbered 7 down to 0, the column-in signals 45 contain the values 00100000 and 00111111.

The External Structure of a Cell of the CM 206

Figure 13:
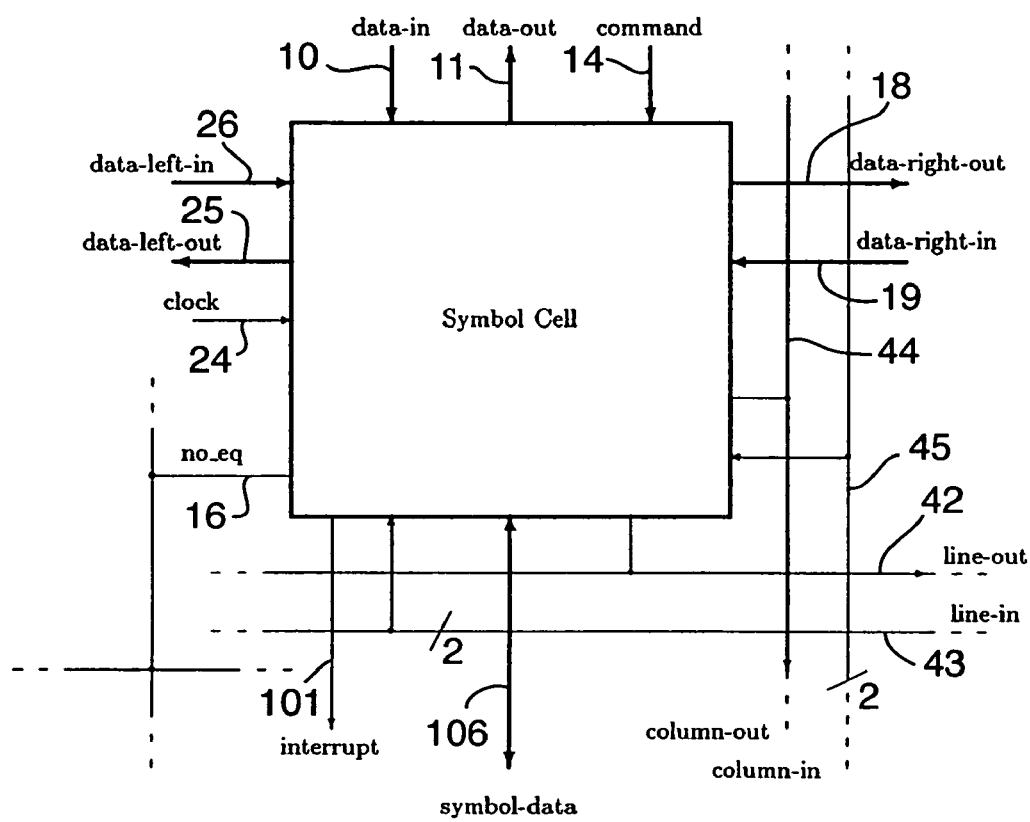
FIG. 13 is a block diagram showing the input and output signals required to interface a dynamic memory cell to its environment.
Figure 14:
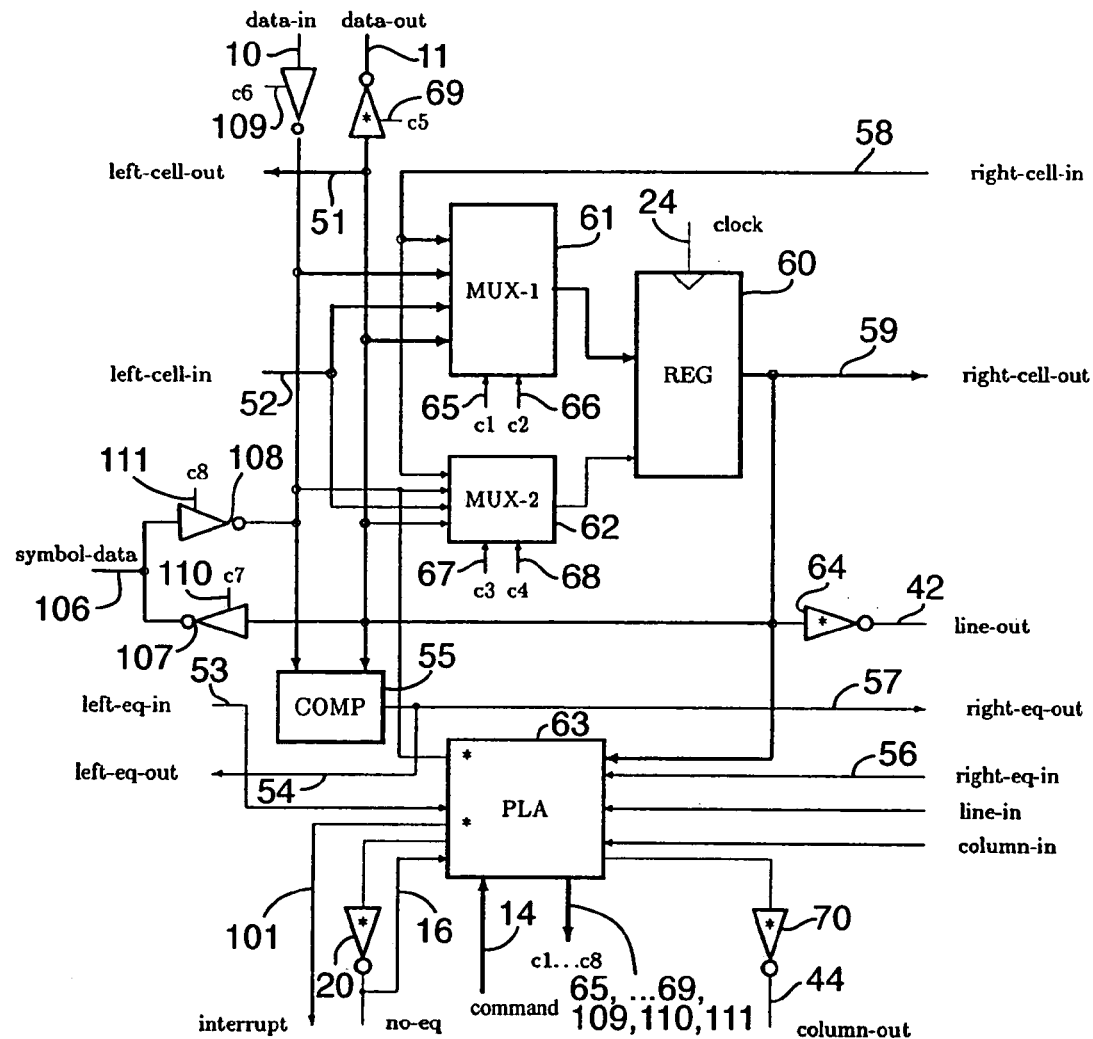
FIG. 14 is a circuit diagram illustrating the internal architecture of the memory cells which contain storage for a symbol and its associated marker according to one embodiment of the invention, through which a symbol and its associated marker can be stored into, read from, or compared to a broadcast symbol.

In addition to the data-in, data-out, and corn signals already presented, the following signals connect the elementary cell containing a symbol and a marker with its environment, as depicted in FIGS. 13 and 14.

Data-left-out: the N+2-bit signals 25 carry the information that is propagated toward the previous cell, and consist of the N+1-bit left-cell-out signals which carry the symbol stored in the cell and its associated marker bit.

Left-eq-out (1): the output signal 54 generated by the comparator 55 inside the cell.

Data-right-out (N+2): the N+2-bit signals carry the information that is propagated toward the next cell, and consist of the N+1-bit right-cell-out signals that carry the symbol stored in the cell and its associated marker bit Right-eq-out (1): the output signal 55 of the comparator inside the cell.

Data-left-in (N+2): the N+2-bit signals carry the information received from the previous cell, and consist of the N+1-bit left-cell-in signals 52, which carry the symbol stored in the previous cell along with its associated marker bit, and the 1-bit signal left-eq-in, 53, which carry the output of the comparator 55 inside the previous cell.

Data-right-in (N+2): these N+2-bit signals carry the information received from the next cell, and consists of the N+1-bit right-cell-in signals 58, which carry the symbol stored in the next cell and its associated marker bit, and the 1-bit signal right-eq-in 56, which is the output of the comparator 55 inside the next cell.

Line-out (1) is an open drain output generating the inverted value of the marker. It is connected in parallel with all the line-out signals 42 from all the other cells on the same line of the two-dimensional array and becomes one of the inputs of the X-transcoder circuit 39.

Column-out (1) is a 1-bit signal 44 and is an open drain output generating the inverted value of the marker only on the first line containing a marked cell. It is connected in parallel with all the column-out outputs of the cells in the same column of the two-dimensional array, and becomes one of the input of the Y-transcoder circuit 40.

Line-in (2): line-in[1] and line-in[0] form the line-in signals 43, which are generated by the X-transcoder circuit 39, and which represent the following conditions:

line-in[1]: the cell belongs to the line containing the first marked cell of the two-dimensional array.

line-in[0]: the cell belongs to a line which is either equal to the line containing the first marked cell of the array or is a line with higher address.

Column-in (2): column-in[1] and column-in[0] form the column-in signals 45, and are generated the Y-transcoder circuit 40. They represent the following conditions:

column-in[1]: the cell belongs to the column containing the first marked cell.

column-in[0]: the cell belongs to a column starting with the column containing the first marked cell.

No-eq: this open drain output 16 is active low when a cfind-type command described in the Summary of the Invention Section succeeds in the cell.

Symbol-data (N+1): these bidirectional signals 106 allow the contents of a cell (N-bit symbol plus a one-bit marker) to be written to or read from an outside storage location.

Interrupt 101: this signal is generated by the cell if the marker is set and the symbol stored is a predefined and unique binary pattern representing an invalid symbol, or indicating that the cell is empty. This signal is generated by an open-drain driver and all the M interrupt signals generated by the M cells in the array are or-ed together to generate the interrupt signal 101 in FIG. 3.

The Internal Structure of the Cell

The internal structure of the cell is shown in FIG. 14, and contains the following circuits:

The REG circuit 60 is an (N+1)-bit register containing the value stored in the cell and that of its associated marker bit.

The MUX1 circuit 61 is a collection of N four-input multiplexers, which allow one of several values to be stored in REG, depending on the selection codes called c1 65, and c2 66. The possible selections for the multiplexer 61 are:

an external value present on the data-in signals 10, an external value present on the symbol-data signals 106, the value from the previous cell, carried by the left-cell-out signals 51, the value from the next cell, carried by the right-cell-in signals 58, or the value stored in the register REG 60, which allows a dynamic implementation of the register.

The MUX2 circuit 62 is a four input multiplexer which allows one of four bits to be stored in the most significant bit of the REG, depending on the selection codes 67 and 68 called c3 and c4. The possible selections for the multiplexer 62 are:
- the marker generated by the PLA 63,
- the marker bit present in the symbol-data 106 signals 106,
- the marker from the previous cell, carried by the signal left-eq-in 53,
- the marker from the next cell, carried by the signal right-eq-in 56, or
- the marker stored in the register REG 60, which allows a dynamic implementation of this bit.

The COMP circuit 55 is a combinational circuit generating a 1 on its one-bit output only when the symbol present on the data-in input signals 10 is equal with the N-bit contents of the cell and which are carried by the signals right-cell-out 59.

Symbol-data (N+1): these signals 106 carry the contents of the cell from a given line, or the contents of the CM 206 cell in REG to an outside storage entity. The direction of the transfer is controlled by the R/W signal 112.

The PLA circuit 63 is a combinational circuit which can be implemented by a programmable logic array and which generates the command bits 65, 66, 67, 68, 69, 107, 109, and 111 called c1, c2, c3, c4, c5, c6, c7, and c8, which are used inside the cell, and the inverted values of the no-eq signal 16, and the column-out signal 44. The open-drain inverter 20 drives the signal no-eq 16. The inverter 70 drives the column-out signal 44.

The PLA 63 receives several input signals:
- the command signals 14, which carries the binary representation of the command to be performed by the CM 206 (find, cfind, index, etc),
- the value of the register REG 60,
- the output of the comparator 55 in the previous cell, brought by the left-eq-in 53 signal,
- the output of the comparator 55 in the next cell, brought by the right-eq-in 56 signal,
- the signal no-eq 16,
- the line-in signal 43 generated by the X-transcoder and the column-in signal 45 generaged by the Y-transcoder circuit.

The PLA 63 generates the interrupt signal 15 which is activated when the register 60 contains a predefined symbol that is used to mark unused or invalid cells, and when the marker associated with the register is set.

The N-bit output of the register 60 representing the symbol stored in it are inverted by N tri-state inverting drivers 71 controlled by the signal c5 69, and they become the signals data-out 11. An open drain inverter 64 inverts the marker bit stored in the register REG 60, and generates the signal line-out 42. An open drain inverter generates the signal no-eq 16, which comes from the PLA 63. An open drain inverter 70 generates the signal column-out 44. Theoretically, all data-out 11 and no-eq 16 outputs from the different cells in the two-dimensional array are connected together, all the line-out 42 outputs belonging to a line are also connected together, and all the column-out signals 44 of the cells on the same column are also connected together.

The Transcoders

Figure 15:
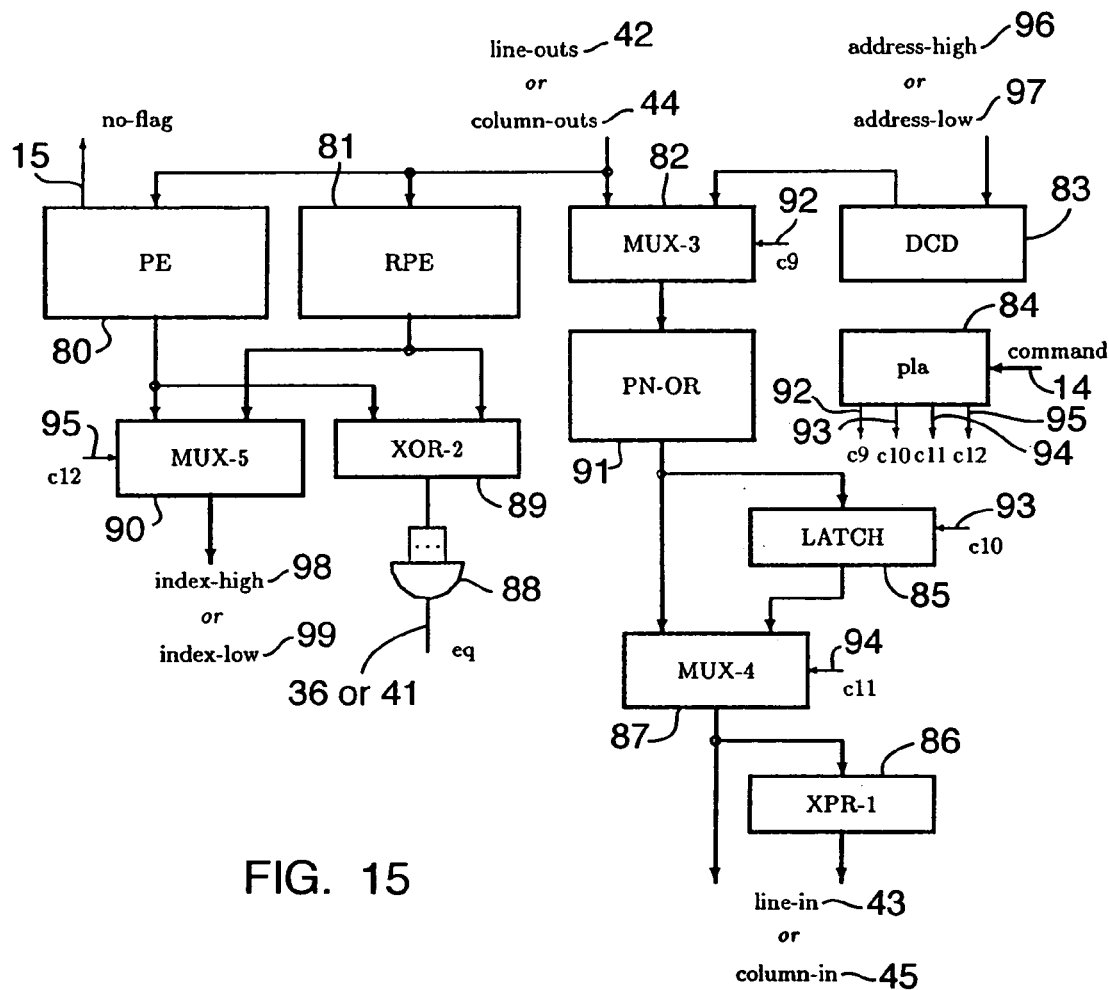
FIG. 15 is a circuit diagram illustrating the internal architecture of the transcoder circuits shown in FIG. 12, according to one embodiment of the invention, through which the two dimensional array of memory cells can be accessed, and which allows the generation of the address of the first or last marked cell.

FIG. 15 illustrates the organization of the two transcoder circuits 39 and 40. The X-transcoder circuit receives the following signals:

The line-outs signals contain $\sqrt{N}$ bits: these signals, one from each line of cells of the two-dimensional array, are used to indicate the presence of a marked cell on the lines.

The Address-high signals 96 contain log(N)/2 bits, and represent the upper half of the address fed to the CM 206, and are used to select one out of the $\sqrt{N}$ lines in the two-dimensional array.

The 5-bit command signals 14 are used only for the implementation of some of the secondary commands: set-limit, set-limit-address, limited-find, limited-cfind, limited-reverse-find, limited-reverse-cfind, limited-write-all, ram-read, and ram-write.

The Y-transcoder circuit 40 receives the following signals:
- the column-outs signals 44 of $\sqrt{M}$ bits, one from each column of the two dimensional array of cells, which indicate the occurrence of a marked cell on the associated column, this marked cell being the first one of the line it belongs to.
- The address-low signals 97 of $\sqrt{M}$ bits which represent the lower half of the address used to select a given line.
- The command signals of 5 bits used only for the implementation of the previously listed secondary commands.

Both transcoders contain the following circuits:
- a decoder DCD 83 used to decode the upper half of the address signals in the X-transcoder 39 or the lower half of the address signals in the Y-transcoder.
- a multiplexer MUX-3 circuit 82 consisting of $\sqrt{M}$ two-way multiplexers, and which uses the c6 signal 92 as a selection signal.
- a prefix network PN-OR circuit 91 for the logic function OR
- a LATCH circuit 85 which latches the output of the PN-OR signal, and used to delimit the active part of the CM 206 for limited operations. It uses the c7 signal 93 as a load command.
- the MUX-4 multiplexer circuit 87 has the same structure as the MUX-3 82 circuit, and uses the c8 signal 94 as a selection signal.
- The linear network XOR-1 86 of $\sqrt{M}$ xor gates is used to determine the first occurrence of 1 in the binary configuration output by the MUX-4 circuit 87.
- A priority encoder PE, 80 for encoding the line-outs 42 in the X-transcoder or the column-outs signals 44 in the Y-transcoder, which generate the upper half of the index field, index-high 38 in the X-transcoder, or the lower half, index-low 46 in the Y-transcoder.
- The RPE priority encoder 81 receives the same input as the PE priority encoder 80, but in reverse order, so that it can generate the upper and lower half the c-index field.
- The PLA circuit 84 is a small combinational logic block which can be implemented by a programmable logic array, and which decodes the command field 14 to generate the c9 bit 92, the c10 bit 93, the c11 bit 94, and the c12 bit 95 that are used to control the transcoder circuits.
- The XOR-2 circuit 89 generates a p/2-bit value, which is fed to a p/2-input AND gate 88, and which generates the eq signal 36. This eq signal is the result of the comparison of the upper-half of the index index-high 98 with the upper contents of the reverse index generated by the RPE circuit 81 in the X-transcoder 39, or the comparison of the lower-half of the index index-low 99, with the lower contents of the reverse index generated by the RPE circuit 81 in the Y-transcoder 40.

The RAM Controller

Figure 17:
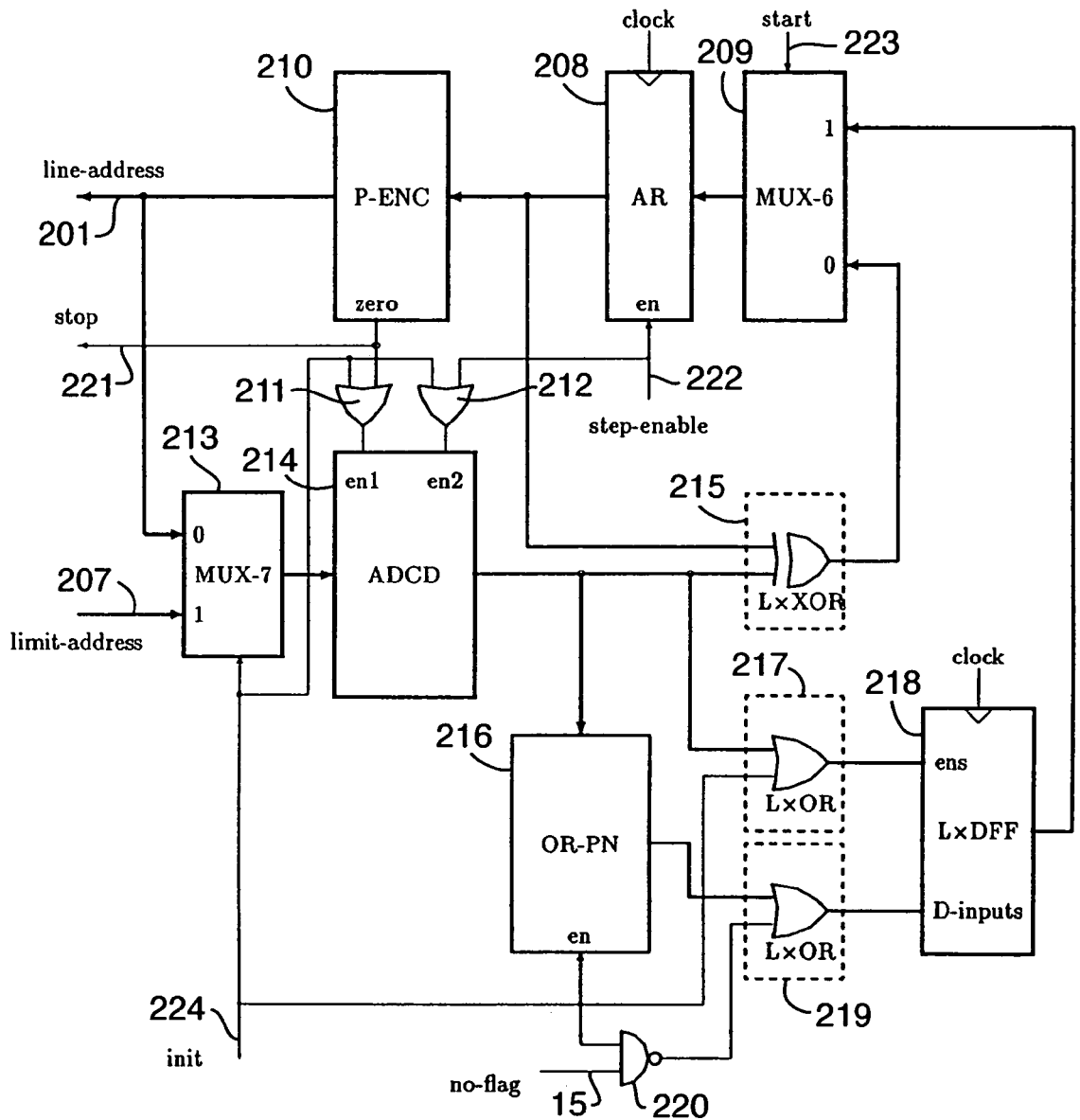
FIG. 17 is a circuit diagram illustrating the internal structure of the RAM controller depicted in FIG. 16.

FIG. 16 illustrates the implementation of the RAM Controller 12, while FIG. 17 is a circuit diagram illustrating the internal structure of the RAM controller 12. The RAM controller keeps two bits of storage for each line stored in the RAM. The first bit is stored in Register AR 208 which contains L bits, one for each line in the RAM. The contents of the L bits are fed to a priority encoder P-ENC 210, which outputs the binary representation of the bit of least weight that is set to 1. The output of the priority encoder 210 is line-address 201, and is the address of the line in the RAM to be selected for the next CM 206 read or write operation. For example, if AR contains 00101110, then P-ENC outputs 010 on line-address, which is the address of the least significant bit in AR that is set to 1. Line-address 201 is also fed to the 0-input of a multiplexer, MUX-7 213, which when appropriately selected, feeds the contents of the line-address signals to decoder ADCD 214. This decoder has L outputs, 1 active and L-1 inactive. The active output has the same weight as the least-significant 1-bit in AR 208 whose weight, or address is output by P-ENC 210. For example, if line-address is 010, then ADCD 214 generates 00000010, where the bit set to 1 has weight 2. The L signals output by ADCD 214 are xored with the L bits output by AR 208 by L xor gates 215 to generate the same binary pattern stored in AR, but where the least-significant 1-bit in AR is now set to 0. Using the same example, if AR contains 00101110, then P-ENC outputs 010, which fed to ADCD become 00000010, which is xored back with 00101110 to yield 00101100, the 0-bit in bold indicating the difference between the contents of AR and the output of the XOR gates 215. The outputs of the XOR gates 215 are fed via a multiplexer MUX-6 209 to the register AR where they are stored on the next clock cycle, when the step-enable signal 222 is active. This signal is part of the corn group of signals 202, and under the control of an outside processing entity which controls the CE 205.

The combination of AR, P-ENC, MUX-7, ADCD, the L XOR gates, and MUX-6 form a circuit that, when starting with a number K stored in binary form in AR, ouputs on line-address the successive powers of 2 whose sum is equal to K. Furthermore, this circuit generates each power of 2 in a constant time, under the control of the step-enable signal. When all the 1-bits have disappeared from the AR register, the priority encoder detects this condition and activates the signal stop 221 which is tested by the outside processing entity as a sign that no more lines need to be processed in the current phase. This device automatically generates the successive weights of all the bits set to 1 in a binary number, in a loop, and the output of each weight takes one cycle only.

While this successive elimination of 1's in the register AR takes place, lines are processed in the CM 206, and string operations performed. At the end of these operations, when the contents of the CM 206 is stored back in the line, the value of the no-flag signal 15, inverted and ored with the init signal 224, is recorded in a D-flip-flop which is one of L D-flip-flop 218. The address of the selected flip-flop in the group of L is the same as the address of the line in the RAM, and the selection of the flip-flop is performed by utilizing the output of the ADCD circuit 214, described below. These L flipflops contain a new pattern of 1s and 0s representing the next group of lines that must be processed in the next pass of operations.

The initialization of the RAM controller requires storing 1's in the bits of AR, in such a way that only the lines in the RAM that need to be processed have their associated AR bits set to 1. These valid lines are stored at consecutive addresses in the RAM, in a contiguous block, and such that the lowest address in the block is 0. For example, if only three lines in the RAM are valid, then the lowest 3 bits of the AR register must be set to 1, and all the others to 0. In this case the address of the highest-address line is 2, since the valid lines have address 0, 1, and 2. In this case, the controlling outside entity sends the address of the highest line to the RAM controller on the limit-address 207 signals, and activates the init signal 224. The resulting actions are that the log(L) address on the limit-address signals pass through multiplexer MUX-7, is decoded by ADCD into L signals, all 0 except for the one with weight equal to the contents of limit-address.

The output of MUX-7 is then fed to a prefix-OR circuit OR-PN 216 which transforms all the bits whose value is 0 and weight less than the weight of the only 1-bit in its input into 1s. For example, if the OR-PN circuit receives 00000100, where the weight of the 1-bit is 2, then its output is 00000111. These L signals are then passed through L OR-gates 219 and fed to the D-input of the L D-flip-flops 218. The L D-flip-flops 218 are individually enabled by the L signals generated by the ADCD circuits, individually OR-ed with the init signal 224. The contents of these L flip-flops where each output of 1 corresponds to a valid line in the RAM is then loaded into the Register AR 208 by activating the start signal controlling the multiplexer MUX-6 209.

Figure 18:
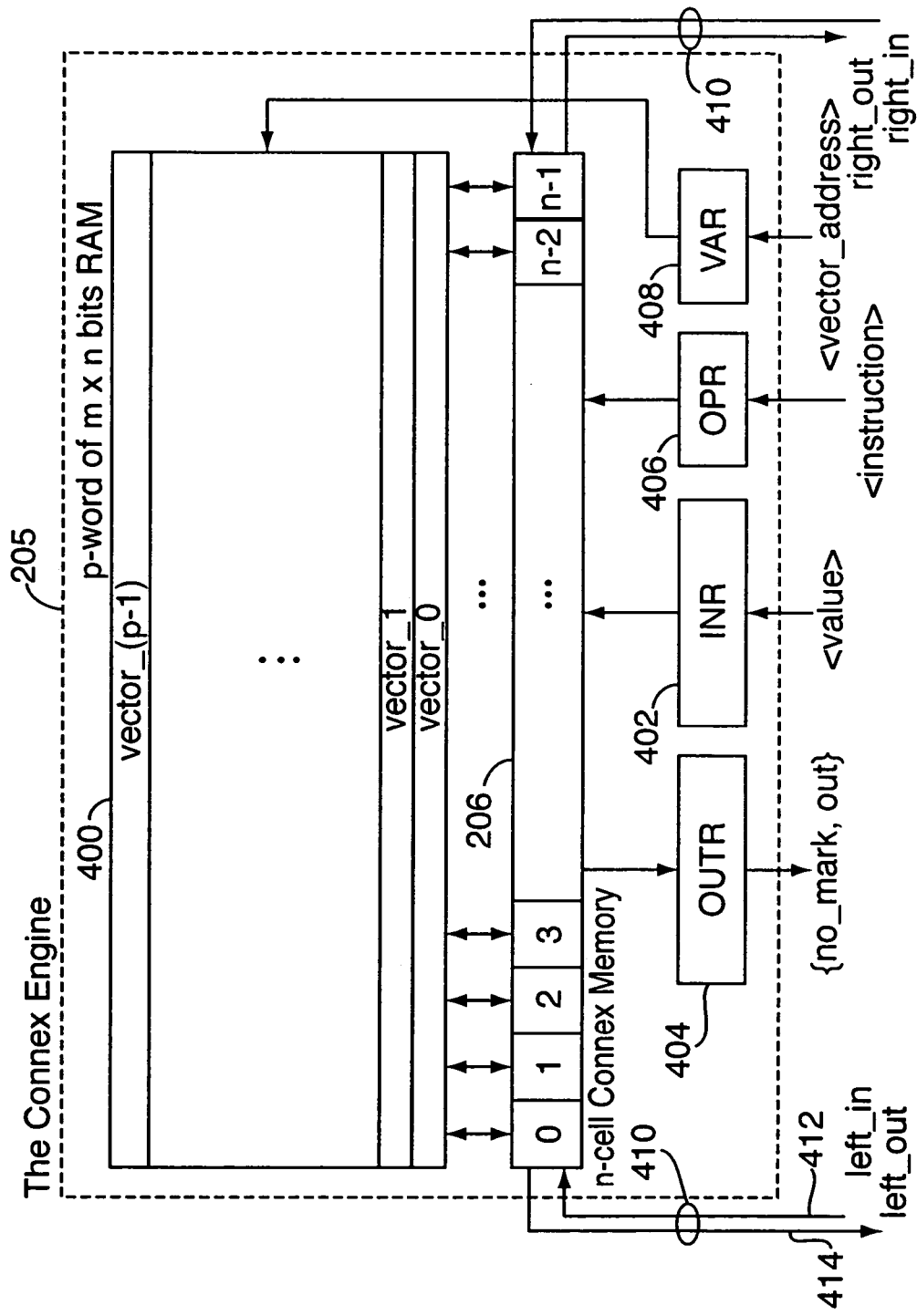
FIG. 18 is a block diagram showing a more detailed view of the memory engine shown in FIG. 1.

As depicted in FIG. 18, the CE 205 is made up of an array of active cells, or processing elements, embodied as the Connex Memory (CM) 206 and a RAM (random access memory) containing a plurality of vectors 400, each vector having the same storage capacity as the CM 206 and thus being capable of selectively storing the entire contents of the CM 206. That is, the CE 205 includes the CM 206 having n-cells and the associated vector memory 400, which is under the control of the controller 255. In one embodiment of the present invention, the purpose of the memory vectors 400, is to allow for search, insert and delete operations to be performed on character strings longer than may be accommodated within the CM 206, and to offer a lower cost of implementation and reduced power dissipation, as will be discussed in more detail later.

The execution of code supplied to the CE 205 is driven by the controller 255. The CE 205/controller 255 interface makes use of four special registers, as also shown in FIG. 18:

'INR' 402—data input register; in one embodiment, all CE 205 instructions get their (immediate) data argument (if any) from INR (supplied by controller 205);

'OUTR' 404—data output—contains the 'no mark' bit and a value. If at least one of the cells is marked, OUTR contains 0 followed by the value contained in the first marked cell; otherwise OUTR contains 1 followed by an implementation-dependent special value, such as 11 . . . 1;

'OPR' 406—instruction register, contains the operation code for the current CE 205 instruction (the source is a dedicated field in the controller 255 instruction);

'VAR' 408—address register for the vector memory. The VAR 408 register is updated by special controller 255 instructions and is used as an argument to instructions that explicitly manipulate vectors; The VAR 408 register is also used in the execution of all operations involving the general registers associated with cells.

As further represented in FIG. 18, input/output lines 410 may be selectively utilized to access both ends of the CM 206. As utilized herein, the input/output lines 410 have the following meaning:

'left_in' 412={w, mark, eq, first}, by default all are 0 (eq=1 means that the two operands in the cell are equal; first=1 means the cell is the first marked cell);

'left_out' 414={w, mark, eq, first}, come from the first cell;

It will be readily appreciated that the present invention contemplates that the CE 205 may have any number of circuit-specific configurations without departing from the broader aspects of the present invention provided that the controller 255 is capable of issuing commands to, and receiving data from, the CE 205. An important aspect, therefore, of the present invention resides in the ability of each m-bit cell within the CM 206 to actively process data in addition to storing data. The processing of data may occur either within each m-bit cell, or by affecting the cell immediately to the left or right of a predetermined cell. It should be noted that by enhancing the functionality of each m-bit cell within the CM 206 in this manner, the present invention exhibits a system-level behavior that is more complex and, as such, exceeds the performance of other data processing systems.

It is another important aspect of the present invention that the ability to actively process data at the cell level within the CM 206 is accomplished, in part, by the ability of each cell to be 'marked', which is part of the condition, or predicate, designating it as a cell which will subsequently perform a task, or execute an operand, on itself, or an adjacent cell within the CM 206.

Yet another inherent advantage of the data processing system of the present invention involves the ability of each cell within the cellular engine to not only simultaneously execute instructions within a single clock cycle, but to also dynamically limit those cells which execute these globally broadcast instructions via the utilization of both local and global state information. In particular, by utilizing marker bits on an individual cell level, the actual cells within the associative memory are capable of affecting those cells either to the left or right of marked cells in a manner which is heretofore unknown. Therefore, at the system level, the present invention provides for the selective activation, or alteration, of the marked state, by associative mechanisms; that is, by the nature or property of the content of the individual cells within the CM 206, rather than a particular designated location address therein.

The present invention therefore combines processing and memory at a very intimate level, meaning that an individual cell of the CM 206 never has to access a separate memory block to do its job. Moreover, operands reside in their own local space at the cell level, therefore results are kept in place, saving communication and processing time, silicon area and power.

The increased flexibility of the CM 206 is also heightened by the capacity of the CM 206 to selectively characterize any portion of the bits stored within its n-cells as being a portion of either the key field or the data field. That is, as opposed to known associative memory architectures where the key field and the data field are strictly defined, the CM 206 is able to consider any of the bits stored within its memory as being a key field bit, or a data field bit, in dependence upon the nature of issued command and desired operation.

Figure 19:
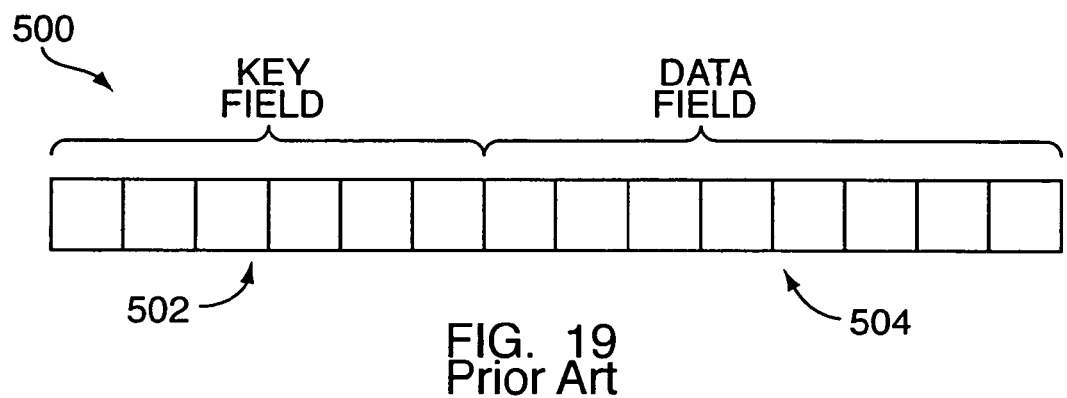
FIG. 19 illustrates the contents of a typical associative memory device.

FIG. 19 illustrates the contents of a typical associative memory 500. It will be readily appreciated that FIG. 19 is a simplistic representation of an associative memory device having a single row of memory cells that include 12 columns. The present invention is of course not limited to such an architecture and indeed contemplates a much greater and more complex array of cells, FIG. 19 being utilized for illustration only.

As shown in FIG. 19, there exists a 6-column key field 502, and an 8-column data field 504. While it will be readily appreciated that the actual length, or size, of the key field 502 and the data field 504 is a matter of design choice, known associative memory engines maintain the distinction between these two fields throughout all commands and operations. That is, known associative memory devices are specialized in the nature and size of their key and data fields. As an example, let's assume that one uses an associative memory to implement a fast database such that its data field represents a particular data content, e.g., information on employees, while the key fields are representative of the last names of employees. Thus, in accordance with a simplified command, a controller in a typical associative memory would search the key field 502 in order to determine if it matches the name "Smith", with data field 504 containing the potentially sought-after data, and would 'tag' all the data fields 504 associated with a key equal to "Smith" in order to indicate the existence or absence of the sought-after data. Note that in this example the key could never be longer than 6 columns.

In the memory engine of the present invention, however, the distinction between the key field and the data field has been removed, thus it is possible for the controller to universally consider and evaluate as part of a key any of the cells contained within either the field 502 or the field 504 in response to an issued command.

It should be noted that the distinction between known associative data processing systems and the present invention is not one of structure, but of software and the implementation of issued commands. That is, in accordance with the present invention, all cells within the associative memory device may be selectively considered by the controller to be either a portion of a 'key', or a portion of the 'data', in dependence upon the specific command issued. Therefore the 'key' or 'data' property of any particular cell is expressed in the command itself, and is not a function of the structural organization of the associative memory device.

Figure 20:
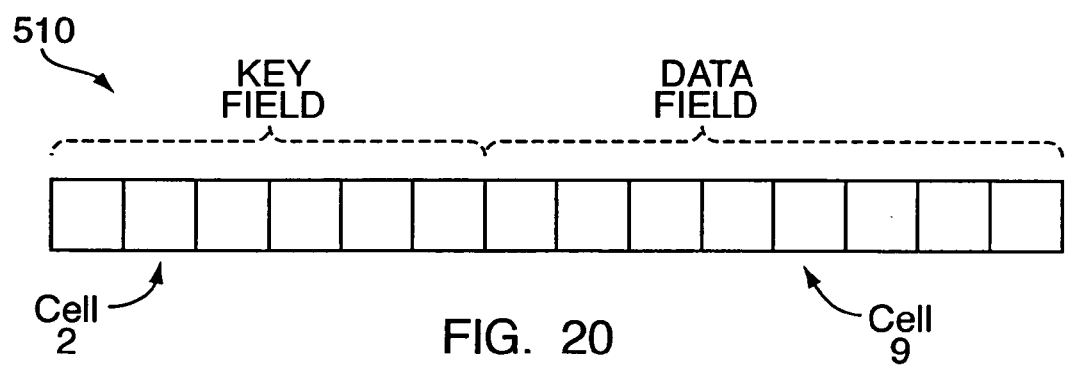
FIG. 20 illustrates an associative memory device wherein the traditional distinction between the key field and the data field has been removed.

As shown in FIG. 20, the controller, in connection with a particular command, may locate the sought-after data in cell 2 (that is, within what is otherwise considered a traditional key field, shown in phantom) of a 14-cell associative memory 510 having 14-cell rows, or it may inspect cell 9 (that is, within what is otherwise considered a traditional data field, shown in phantom) as part of the key. It will therefore be readily appreciated that the associative memory engine of the present invention exhibits far greater flexibility than known associative memory engines.

Indeed, because the present invention effectively eliminates the traditional distinction between the key field and the data field within the associative memory device, the programming capability of the memory engine is significantly increased.

Returning to the example above concerning the last names of employees, known associative memory systems are typically specialized, or tailored, to a particular use, and would therefore be incapable of searching or identifying data having a radically different structure (e.g. 16-column keys and 1024-column data). In stark contrast, because the present invention does not recognize any distinction between the key field and the data field, indeed because the present invention selectively re-defines the nature of what is considered a 'key' in connection with each separate command, the present invention is capable of enabling an essentially generic associative memory system.

By way of an example, an associative memory support for data processing in accordance with the present invention may first be controlled to identify all employees' last names by utilizing, e.g., a 5-cell key. The next command issued by the controller could then be utilized to locate another type of data based upon, e.g., a 2-cell key, or the like. Thus, the present invention avoids the necessity to re-design, or specialize, the machine for each particular use, as is the case with known associative memory systems. In contrast, the present invention's ability to individualize each key in accordance with each issued command, enables the present invention to support a non-specialized associative memory that may be selectively mined for specialized data merely by utilizing keys of selected lengths and content.

In this regard, it should be readily appreciated that the implementation of the commands previously discussed in connection with FIGS. 3–10 are due, at least in part, upon the unique ability of the memory engine to remove, or ignore, the traditional distinctions between the key and data fields within the CM 206.

It will also be readily appreciated that the ability of the controller 255 to globally broadcast a predetermined command to each of the n-cells in the CM 206 within one clock cycle, as well as the ability for each of the n-cells to process the issued command within a single clock cycle, is equally applicable to, and encouraged by, the ability of the memory device to make use of all bits within each of the n-cells regardless of their location or of any distinction between the key and data fields.

While the invention had been described with reference to the preferred embodiments, it will be understood by those skilled in the art that various obvious changes may be made, and equivalents may be substituted for elements thereof, without departing from the essential scope of the present invention. Therefore, it is intended that the invention not be limited to the particular embodiments disclosed, but that the invention includes all embodiments falling within the scope of the appended claims.

What is claimed is:

1. A data processing system comprising:
   an associative memory device containing n-cells, wherein n is any known whole number greater than zero;
   a controller for issuing a command to said n-cells in said associative memory device; and
   wherein said command defines a size and location of a key field within each of said n-cells, said key field being utilized to identify data within said n-cells.

2. An associative memory system for data processing, said associative memory system comprising:
   an associative memory device containing n-cells, n being any known whole number greater than zero;
   a controller for issuing an instruction to said n-cells; and
   wherein said instruction defines a size of a key field utilized in an execution of said instruction.

3. The associative memory system for data processing system according to claim 2, wherein:
   said defined size of said key field is applied to all of said n-cells.

4. An associative memory system for data processing, said associative memory system comprising:
   an associative memory device containing n-cells, n being any known whole number greater than zero, and wherein each of said n-cells stores m-bits of data therein, m being any known whole number greater than zero;
   a controller for issuing an instruction to said n-cells; and
   wherein said instruction selectively defines which of said m-bits within each of said n-cells represents a key field for each of said n-cells.

5. An associative memory system for data processing, said associative memory system comprising:
   an associative memory device containing n-cells, each of said n-cells storing m-bits of data, wherein n and m are any known whole number greater than zero;
   a controller for issuing an instruction to said n-cells; and
   wherein said instruction selectively designates which of said m-bits within each of said n-cells is to act as a key field in accordance with said issued instruction.

* * * * *